US011417669B2

United States Patent
Han et al.

(10) Patent No.: US 11,417,669 B2
(45) Date of Patent: Aug. 16, 2022

(54) STACKED BODY SEMICONDUCTOR STORAGE DEVICE HAVING AN ELECTRODE BETWEEN A PILLAR AND A WIRING AND INSULATING LAYERS HAVING DIFFERENT DIELECTRIC CONSTANTS BETWEEN THE ELECTRODE AND THE WIRING

(71) Applicant: KIOXIA CORPORATION, Tokyo (JP)

(72) Inventors: Yefei Han, Yokkaichi Mie (JP); Yusuke Arayashiki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/010,776

(22) Filed: Sep. 2, 2020

(65) Prior Publication Data

US 2021/0296332 A1  Sep. 23, 2021

(30) Foreign Application Priority Data

Mar. 23, 2020 (JP) .............................. JP2020-051392

(51) Int. Cl.
*H01L 27/11* (2006.01)
*H01L 27/11521* (2017.01)
*H01L 23/00* (2006.01)
*H01L 27/11519* (2017.01)

(52) U.S. Cl.
CPC ........ *H01L 27/11521* (2013.01); *H01L 24/46* (2013.01); *H01L 27/11519* (2013.01)

(58) Field of Classification Search
CPC ............... H01L 27/11521; H01L 24/46; H01L 27/11519

USPC .......................... 257/314; 438/201, 211, 257
See application file for complete search history.

(56) References Cited

U.S. PATENT DOCUMENTS

| 2011/0001182 A1* | 1/2011 | Sato ................... H01L 27/0207 257/324 |
| 2014/0048868 A1* | 2/2014 | Kim ................... H01L 27/11582 257/324 |
| 2016/0079269 A1* | 3/2016 | Sekine ................ H01L 27/1157 257/314 |
| 2016/0268277 A1* | 9/2016 | Nagashima ....... H01L 27/11524 |
| 2017/0069647 A1* | 3/2017 | Ohashi ............. H01L 29/66825 |
| 2018/0269218 A1 | 9/2018 | Kato et al. |

(Continued)

*Primary Examiner* — Didarul A Mazumder
(74) *Attorney, Agent, or Firm* — Kim & Stewart LLP

(57) ABSTRACT

A semiconductor memory device includes a semiconductor pillar including a semiconductor layer and extending along a first direction, a first wiring extending along a second direction crossing the first direction, a first electrode between the semiconductor pillar and the first wiring, a first insulating layer between the first electrode and the first wiring and adjacent to the first electrode, a second insulating layer between the first insulating layer and the first wiring and adjacent to the first insulating layer, the second insulating layer having a higher dielectric constant than the first insulating layer, and a third insulating layer between the second insulating layer and the first wiring. A shortest distance between the second insulating layer and the semiconductor layer in the second direction is greater than a shortest distance between the first electrode and the semiconductor layer in the second direction.

13 Claims, 16 Drawing Sheets

(56) References Cited

U.S. PATENT DOCUMENTS

2018/0337195 A1   11/2018   Jayanti et al.
2019/0198509 A1    6/2019   Kim
2019/0259774 A1    8/2019   Murakoshi et al.
2019/0273092 A1*   9/2019   Sasaki .................... G11C 5/025

* cited by examiner

STACKED BODY SEMICONDUCTOR STORAGE DEVICE HAVING AN ELECTRODE BETWEEN A PILLAR AND A WIRING AND INSULATING LAYERS HAVING DIFFERENT DIELECTRIC CONSTANTS BETWEEN THE ELECTRODE AND THE WIRING

CROSS-REFERENCE TO RELATED APPLICATION(S)

This application is based upon and claims the benefit of priority from Japanese Patent Application No. 2020-051392, filed Mar. 23, 2020, the entire contents of which are incorporated herein by reference.

FIELD

Embodiments described herein relate generally to a semiconductor storage device.

BACKGROUND

There has been proposed a semiconductor storage device having a stacked body in which insulating films and conductive word lines are stacked alternately. A semiconductor pillar extends through the stacked body. Such a semiconductor storage device needs to have improved reliability.

DETAILED DESCRIPTION

Figure 1:
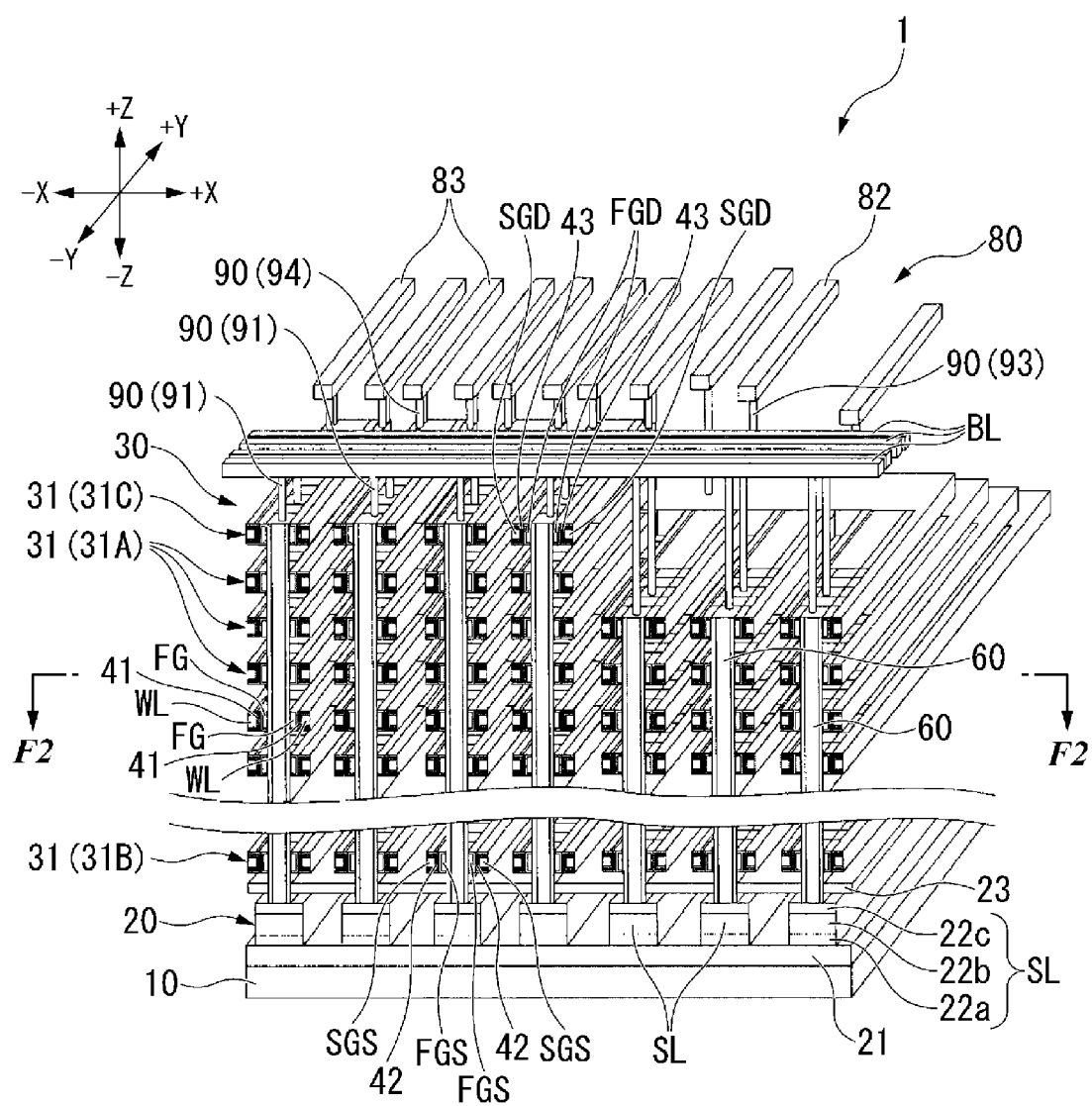
FIG. 1 is a perspective view illustrating a semiconductor storage device according to a first embodiment.

In general, according to one embodiment, a semiconductor memory device includes a semiconductor pillar. The semiconductor pillar includes a semiconductor layer and extends along a first direction. A first wiring extends along a second direction crossing the first direction. A first electrode is arranged between the semiconductor pillar and the first wiring. A first insulating layer is arranged between the first electrode and the first wiring and adjacent to the first electrode. A second insulating layer is arranged between the first insulating layer and the first wiring and adjacent to the first insulating layer. The second insulating layer has a higher dielectric constant than the first insulating layer. A third insulating layer is arranged between the second insulating layer and the first wiring. A shortest distance between the second insulating layer and the semiconductor layer in the second direction is greater than a shortest distance between the first electrode and the semiconductor layer in the second direction.

Hereinafter, semiconductor storage devices according to certain example embodiments will be described with reference to the drawings. In the following description, configurations having the same or substantially similar functions are denoted using the same reference numerals. Furthermore, overlapping explanation of such configurations may be omitted in subsequent description of embodiments. In the present disclosure, the term "connection" is not limited to a case of being physically connected, but includes a case of being electrically connected. In the present disclosure, the term "adjacent" includes cases where another element is between two other elements. In the present disclosure, the phrase "providing XX on YY" is not limited to a case where XX is in direct contact with YY, but includes a case where another member is interposed between XX and YY. In the present disclosure, the term "annular" is not limited to a toric shape, but includes a rectangular annular shape. In the present disclosure, the term "arc-shaped" is intended to broadly mean a shape similar to an arc when viewed generally, and such an "arc-shaped" element or component may include portions having a different curvatures or a portion extending linearly in the middle or at the end of such shape. In the present disclosure, the term "parallel" and "orthogonal" include cases of "substantially parallel" and "substantially orthogonal", respectively.

First, a +X direction, a −X direction, a +Y direction, a −Y direction, a +Z direction, and a −Z direction referred to in this disclosure will be defined as follows. The +X direction, the −X direction, the +Y direction, and the −Y direction are directions paralleling the surface of a silicon substrate 10. The +X direction is a direction in which a bit line BL extends. The −X direction is the opposite direction to the +X direction. When the +X direction and the −X direction are not distinguished from each other, the directions are simply referred to as an "X direction". The +Y direction and the −Y direction are directions intersecting (e.g., orthogonal to) the X direction. The +Y direction is a direction in which a word line WL extends. The −Y direction is the opposite direction to the +Y direction. When the +Y direction and the −Y direction are not distinguished from each other, the directions are simply referred to as a "Y direction". The +Z direction and the −Z direction are directions intersecting (e.g., orthogonal to) the X direction and the Y direction, and are along the thickness direction of the silicon substrate 10. The +Z direction is a direction from the silicon substrate 10 toward stacked body 30. The −Z direction is the opposite direction to the +Z direction. When the +Z direction and the −Z direction are not distinguished from each other, the directions are simply referred to as a "Z direction". In the present disclosure, the "+Z direction" may be referred to as "upper" direction, or the like, and the "−Z direction" may be referred to as "lower" direction, or the like. However, these expressions are for convenience and do not necessarily reference the direction of gravity.

First Embodiment

<1. Entire Configuration of Semiconductor Storage Device>

First, the configuration of a semiconductor storage device according to a first embodiment will be described. The semiconductor storage device 1 is a non-volatile semiconductor storage device, for example, a NAND type flash memory.

FIG. 1 is a perspective view illustrating the semiconductor storage device 1. The semiconductor storage device 1 includes, for example, a silicon substrate 10, a lower structure 20, a stacked body 30, a plurality of semiconductor pillars (columnar bodies) 60, an insulating dividing portion 70 (see FIG. 2), an upper structure 80, and a plurality of contacts 90. Further, in FIG. 1, the semiconductor pillars 60 are schematically illustrated as square columnar shapes.

The silicon substrate 10 is a substrate which is a base of the semiconductor storage device 1. At least a portion of the silicon substrate 10 is formed in a plate shape along the X direction and the Y direction. The silicon substrate 10 is made of, for example, a semiconductor material containing silicon (Si).

The lower structure 20 is provided on the silicon substrate 10. The lower structure 20 includes, for example, a lower insulating film 21, a plurality of source lines SL, and an upper insulating film 23. The lower insulating film 21 is provided on the silicon substrate 10. The source lines SL are provided on the lower insulating film 21. The source lines SL are adjacent to each other in the X direction and extend in the Y direction. Each of the source lines SL includes, for example, a conductive layer 22a provided on the lower insulating film 21, a wiring layer 22b provided on the conductive layer 22a, and a conductive layer 22c provided on the wiring layer 22b. The upper insulating film 23 is provided above the source lines SL. An insulating material is provided between the source line SL and the upper insulating film 23, and between the lower insulating film 21 and the upper insulating film 23.

The stacked body 30 is provided on the lower structure 20. The stacked body 30 includes, for example, a plurality of functional layers 31 and a plurality of interlaying insulating films 32 (see FIG. 3). The functional layers 31 and the interlayer insulating films 32 are alternately stacked one by one in the Z direction. The functional layers 31 include a plurality of first functional layers 31A, one or more second functional layers 31B, and one or more third functional layers 31C.

Each of the first functional layers 31A includes, for example, a plurality of word lines WL, a plurality of floating gate electrodes FG, and a plurality of block insulating films 41. The word lines WL are wirings provided on the side of the semiconductor pillar 60. The word lines WL in one first functional layer 31A are adjacent to each other in the X direction and extend in the Y direction. When electrons are injected into the floating gate electrode FG or when electrons injected into the floating gate electrode FG are removed from the floating gate electrode FG, a voltage is applied to a word line WL by a drive circuit and a predetermined voltage is applied to the floating gate electrode FG connected to the word line WL.

Each of the floating gate electrodes FG is an electrode film provided on the side of the semiconductor pillar 60. The floating gate electrode FG is a film having the ability to store charges. The floating gate electrode FG changes the storage state of electrons when a voltage is applied by a word line WL. Each floating gate electrode FG is provided between the word line WL corresponding to the floating gate electrode FG and the semiconductor pillar 60 corresponding to the floating gate electrode FG. In the present disclosure, the term "corresponding" means, for example, elements that form one memory cell by being combined with each other.

Each of the block insulating films 41 is provided between the word line WL corresponding to the block insulating film 41 and the floating gate electrode FG corresponding to the block insulating film 41. The configuration of the first functional layers 31A will be described later.

The second functional layer 31B is provided below the first functional layers 31A. The second functional layer 31B includes, for example, a plurality of source side select gate lines SGS, a plurality of source side select gate electrodes FGS, and a plurality of block insulating films 42. The source side select gate lines SGS are adjacent to each other in the X direction and extend in the Y direction. Each of the source side select gate electrodes FGS is provided between the source side select gate line SGS corresponding to the source side select gate electrode FGS and the semiconductor pillar 60 corresponding to the source side select gate electrode FGS. Each of the block insulating films 42 is provided between the source side select gate line SGS corresponding to the block insulating film 42 and the source side select gate electrode FGS corresponding to the block insulating film 42. A voltage is applied to the source side select gate line SGS by a drive circuit when the semiconductor pillar 60 and the source line SL are electrically connected, and a predetermined voltage is applied to the source side select gate electrode FGS connected to the source side select gate line SGS.

The third functional layer 31C is provided above the first functional layers 31A. The third functional layer 31C includes, for example, a plurality of drain side select gate lines SGD, a plurality of drain side select gate electrodes FGD, and a plurality of block insulating films 43. The drain side select gate lines SGD are adjacent to each other in the X direction and extend in the Y direction. Each of the drain side select gate electrodes FGD is provided between the word line WL corresponding to the drain side select gate electrode FGD and the semiconductor pillar 60 corresponding to the drain side select gate electrode FGD. Each of the block insulating films 43 is provided between the drain side select gate line SGD corresponding to the block insulating film 43 and the drain side select gate electrode FGD corresponding to the block insulating film 43. A voltage is applied to the drain side select gate line SGD by a drive circuit when the semiconductor pillar 60 and the source line SL are electrically connected, and a predetermined voltage is applied to the drain side select gate electrode GD connected to the drain side select gate line SGD.

The semiconductor pillars 60 are provided on the source lines SL and extend in the Z direction. The semiconductor pillars 60 are provided apart from each other in the X direction and the Y direction. For example, the semiconductor pillars 60 are arranged in the form of a matrix along the X direction and the Y direction when viewed in the Z direction. The lower end of each semiconductor pillar 60 is connected to the source line SL through the upper insulating film 23 of the lower structure 20. The structure of the semiconductor pillar 60 and the structure of the insulating dividing portion 70 will be described later.

The upper structure 80 is provided on the stacked body 30. The upper structure 80 includes, for example, a plurality of bit lines BL, a source side select gate line SGS wiring, a word line WL wiring 82, and a drain side select gate line SGD wiring 83.

The contacts 90 extend in the Z direction. The contacts 90 include, for example, a plurality of contacts 91 for the semiconductor pillars 60, a plurality of contacts for the source side select gate lines SGS, a plurality of contacts 93 for the word lines WL, and a plurality of contacts 94 for the drain side select gate lines SGD.

The contacts 91 are provided on the semiconductor pillar 60. The bit lines BL are adjacent to each other in the Y direction and extend in the X direction. Of the plurality of semiconductor pillars 60 arranged in the X direction, when the semiconductor pillar 60 provided closest to the −X direction is the first semiconductor pillar 60, the odd-numbered semiconductor pillars 60 is connected to the common bit line BL via the contacts 91. The even-numbered semiconductor pillars 60 are connected to another common bit line BL via the contacts 91. That is, the semiconductor pillars 60 adjacent to each other among the plurality of semiconductor pillars 60 arranged in the X direction are not connected to the same bit line BL.

A plurality of contacts is provided on an end portion of the source side select gate line SGS in the +Y direction. Wirings are provided on the contacts and extend in the Y direction. These wirings are connected to the source side select gate line SGS via the contacts.

The contacts 93 are provided on the end portion of the word line WL in the Y direction. The wiring 82 is provided on the contacts 93 and extends in the Y direction. The wiring 82 is connected to the word line WL via the contacts 93.

The contacts 94 are provided on an end portion of the drain side select gate line SGD in the +Y direction. The wiring 83 is provided on the contacts 94 and extends in the Y direction. The wiring 83 is connected to the drain side select gate line SGD via the contacts 94.

<2. Structure of Stacked Body>

Figure 2:
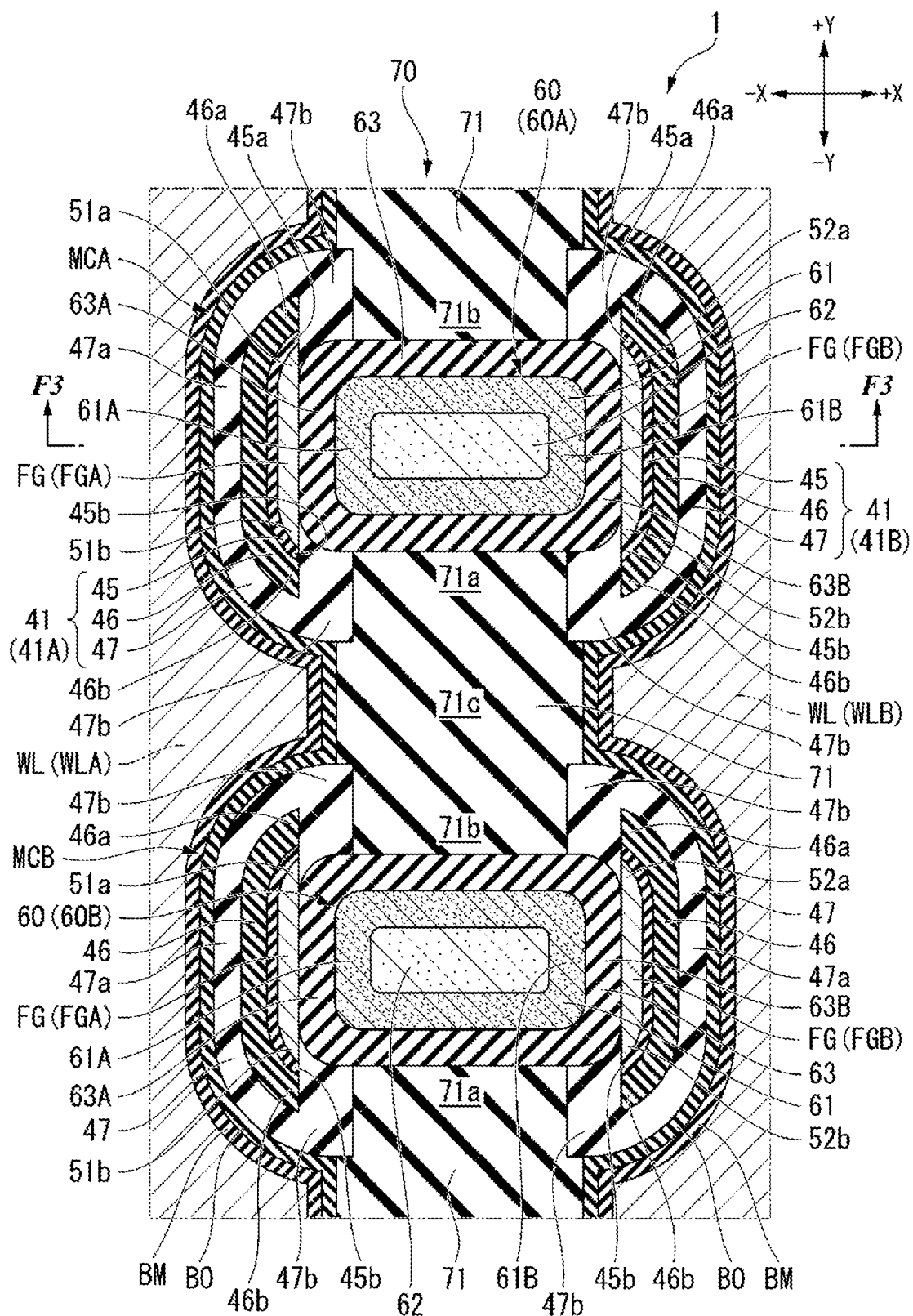
FIG. 2 is a cross-sectional view of a stacked body which is taken along line F2-F2 in FIG. 1.
Figure 3:
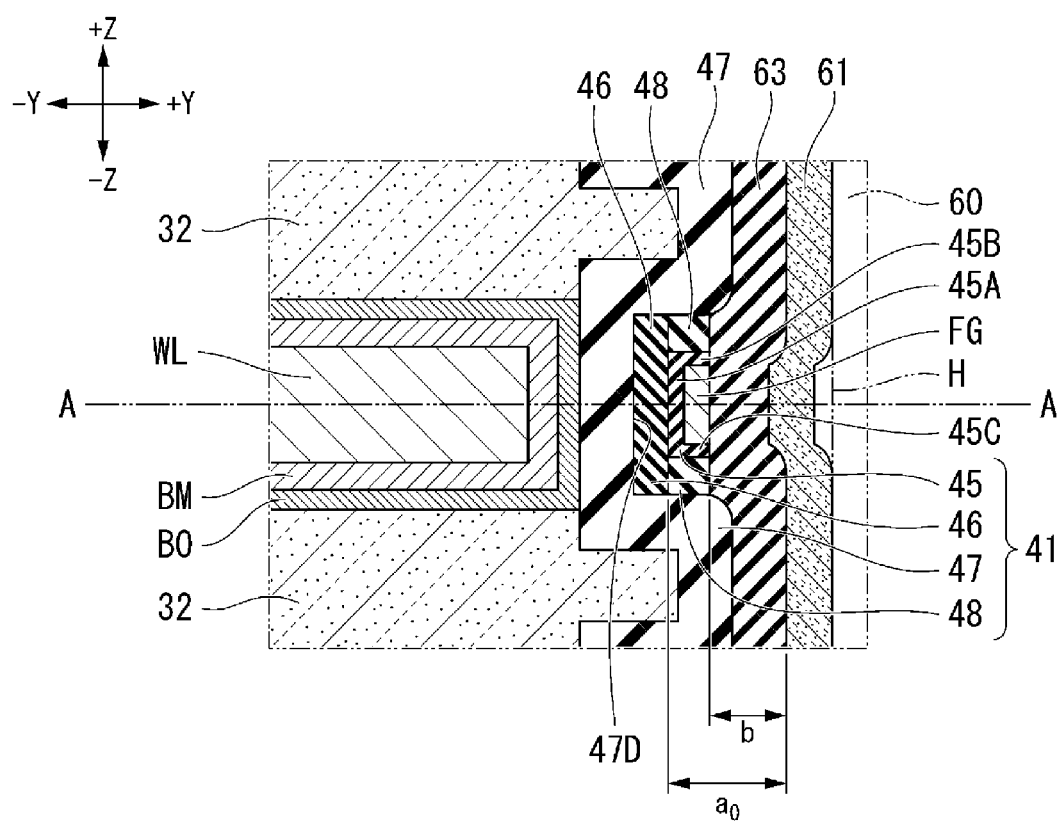
FIG. 3 is a cross-sectional view of a stacked body which is taken along line F3-F3 in FIG. 2.

Next, the structure of the stacked body 30 will be described in detail. FIG. 2 is a cross-sectional view of the stacked body 30 illustrated in FIG. 1, which is taken along line F2-F2. FIG. 3 is a cross-sectional view of the stacked body 30 illustrated in FIG. 2, which is taken along line F3-F3.

The stacked body 30 has a memory structure capable of storing information around each semiconductor pillar 60. The memory structures provided around the semiconductor pillars 60 have the same structure. Therefore, the following description focuses on two semiconductor pillars 60 (a first semiconductor pillar 60A and a second semiconductor pillar 60B), and will be mainly given of the structure around the semiconductor pillars 60A and 60B.

<2.1. Word Line>

First, the word lines WL will be described. As illustrated in FIG. 2, the word lines WL include a first word line WLA located on the −X direction side and a second word line WLB located on the +X direction side with respect to each semiconductor pillar 60. The first word line WLA and the second word line WLB are adjacent to each other in the X direction and extend in the Y direction. The first word line WLA and the second word line WLB are drawn out in opposite directions, for example, in the Y direction, and are controlled independently of each other.

The word line WL is made of, for example, tungsten. A barrier metal film BM that prevents diffusion of the material of the word line WL is provided on the surface of the word line WL. The barrier metal film BM is made of, for example, titanium nitride (TiN). A block film BO is formed on the surface of the barrier metal film BM. The block film BO is made of, for example, AlO.

<2.2. Floating Gate Electrode>

Next, the floating gate electrodes FG will be described. As illustrated in FIG. 2, the floating gate electrodes FG include a first floating gate electrode FGA located on the −X direction side and a second floating gate electrode FGB located on the +X direction side with respect to each semiconductor pillar 60. The first floating gate electrode FGA is provided between the first word line WLA and the semiconductor pillar 60 (more specifically, between the first word line WLA and a first channel 61A of the semiconductor pillar 60). The second floating gate electrode FGB is provided between the second word line WLB and the semiconductor pillar 60 (more specifically, between the second word line WLB and a second channel 61B of the semiconductor pillar 60).

The floating gate electrode FG is made of, for example, polysilicon. The first floating gate electrode FGA changes the storage state of electrons when a voltage is applied by the first word line WLA. The second floating gate electrode FGB changes the storage state of electrons when a voltage is applied by the second word line WLB.

As illustrated in FIG. 2, the first floating gate electrode FGA has, for example, a first portion 51a and a second portion 51b. The first portion 51a has a shape in which the thickness thereof gradually decreases toward the Y direction from the central portion of the first floating gate electrode FGA. The first portion 51a projects toward the +Y direction side more than the end of the channel 61 in the +Y direction side. The second portion 51b has a shape in which the thickness thereof gradually decreases toward the −Y direction from the central portion of the first floating gate electrode FGA. The second portion 51b projects toward the −Y direction side more than the end of the channel 61 in the −Y direction side. In the first floating gate electrode FGA, the first portion 51a, the central portion, and the second portion 51b extend substantially linearly along the Y direction in the cross section illustrated in FIG. 2. In the first portion 51a, the surface on the semiconductor pillar 60 side has a planar portion, and the surface on the opposite side is formed into a curved surface. In the second portion 51b, the surface on the semiconductor pillar 60 side has a planar portion, and the surface on the opposite side is formed into a curved surface.

The structure in which the first portion 51a and the second portion 51b illustrated in FIG. 2 linearly extend is illustrated as an example, but it may have a shape curved along a first curved portion 45a and a second curved portion 45b of a first block insulating film 45.

Similarly, the second floating gate electrode FGB has, for example, a first portion 52a and a second portion 52b. The first portion 52a has a shape in which the thickness thereof gradually decreases toward the Y direction from the central portion of the second floating gate electrode FGB. The first portion 52a projects toward the +Y direction side more than the end of the channel 61 in the +Y direction side. The second portion 52b has a shape in which the thickness thereof gradually decreases toward the Y direction from the central portion of the second floating gate electrode FGB. The second portion 52b projects toward the −Y direction side more than the end of the channel 61 in the −Y direction side. In the second floating gate electrode FGB, the first portion 52a, the central portion, and the second portion 52b extend substantially linearly along the Y direction in the cross section illustrated in FIG. 2. In the first portion 52a, the surface on the semiconductor pillar 60 side has a planar portion, and the surface on the opposite side is formed into a curved surface. In the second portion 52b, the surface on the semiconductor pillar 60 side has a planar portion, and the surface on the opposite side is formed into a curved surface.

The structure in which the first portion 52a and the second portion 52b illustrated in FIG. 2 linearly extend is illustrated as an example, but it may have a shape curved along the first curved portion 45a and the second curved portion 45b of the first block insulating film 45.

<2.3. Block Insulating Film>

Next, the block insulating films 41 will be described. As illustrated in FIG. 2, the block insulating films 41 include a block insulating film 41A located on the −X direction side and a block insulating film 41B located on the +X direction side with respect to each semiconductor pillar 60. The block insulating film 41A is provided between the first word line WLA and the first floating gate electrode FGA. The block insulating film 41B is provided between the second word line WLB and the second floating gate electrode FGB.

Each of the block insulating films 41A and 41B includes a first block insulating film 45, a second block insulating film 46, a third block insulating film 47, and a fourth block insulating film 48.

The first block insulating film 45 is located closest to the floating gate electrode FG among the four block insulating films 45, 46, 47, and 48. The first block insulating film 45 covers, for example, the side surface, the upper surface, and the lower surface of the floating gate electrode FG in the cross section illustrated in FIG. 3. The first block insulating film 45 is disposed, for example, on the block insulating film 41A side of the cross section illustrated in FIG. 2, so as to be in contact with the central portion, the first portion 51a, and the second portion 51b of the floating gate electrode FGA. The first block insulating film 45 is disposed, for example, on the block insulating film 41B side of the cross section illustrated in FIG. 2, so as to be in contact with the central portion, the first portion 52a, and the second portion 52b of the floating gate electrode FGA. The first block insulating film 45 is formed of, for example, SiN and SiON, a stacked film of SiO/SiON, or a stacked film of SiO/SiN.

Hereinafter, since the four block insulating films 45 to 48 forming the block insulating film 41A and the four block insulating films 45 to 48 forming the block insulating film 41B have the same configuration except that the films are formed at different positions and directions, the structure on the block insulating film 41A side will be mainly described.

The first block insulating film 45 on the side of the block insulating film 41A illustrated in FIG. 2 is formed in substantially an arcuate shape that swells from the central portion of the floating gate electrode FGA in the Y direction toward the −Y direction. The first block insulating film 45 has the first curved portion 45a at the end portion in the +Y direction and the second curved portion 45b at the end portion in the −Y direction.

The second block insulating film 46 is provided on the opposite side of the first block insulating film 45 from the floating gate electrode FGA. The second block insulating film 46 covers the side surface of the floating gate electrode FG with the first block insulating film 45 interposed in, for example, the cross section illustrated in FIG. 3. For example, in the cross section illustrated in FIG. 2, the second block insulating film 46 covers and contacts the upper portion, through the central portion, to the lower portion on the −X side of the first block insulating film 45 along the Y direction. The second block insulating film 46 on the side of the block insulating film 41A illustrated in FIG. 2 is formed in substantially an arcuate shape that swells from the central portion of the floating gate electrode FGA in the Y direction toward the −Y direction. The second block insulating film 46 has a first curved portion 46a at the end portion in the +Y direction and a second curved portion 46b at the end portion in the −Y direction.

The second block insulating film 46 is made of, for example, a High-k material (i.e., a high dielectric constant material) such as silicon nitride (SiN), hafnium oxide (HfO), or hafnium silicate (HfSiO$_x$). The second block insulating film 46 may be made of another High-k material such as ZrO$_x$, HfZrO$_x$, AlO$_x$, HfAlO$_x$, or YO$_x$.

However, the insulating film 45 may be made of a material containing one or more of ruthenium (Ru), aluminum (Al), titanium (Ti), zirconium (Zr), silicon (Si), tungsten (W), titanium nitride (TiN), tantalum (Ta) and molybdenum (Mo).

The third block insulating film 47 has a first covering portion 47a provided on the opposite side of the block insulating films 45 and 46 from the floating gate electrode FG. The third block insulating film 47 further has second covering portions 47b provided on the semiconductor pillar 60 side. As illustrated in FIG. 2, the first covering portion 47a covers the word line WL side (i.e., the first word line WLA side) from the upper portion to the lower portion of the second block insulating film 46 in the −X direction. In the cross section of FIG. 2, the first covering portion 47a is drawn in substantially an arcuate shape. In the third block insulating film 47, the second covering portion 47b is formed at each of the end of the first covering portion 47a in the +Y direction on the insulating dividing portion 70 side and the end portion of the first covering portion 47a in the −Y direction on the insulating dividing portion 70 side.

The second covering portion 47b at the end portion in the +Y direction partially covers the first portion 51a of the floating gate electrode FG, the first curved portion 45a of the first block insulating film 45, and the first curved portion 46a of the second block insulating film 46. The second covering portion 47b at the end portion in the +Y direction is in contact with the insulating dividing portion 70 and a portion of a tunnel insulating film 63.

The second covering portion 47b at the end portion in the −Y direction partially covers the second portion 51b of the floating gate electrode FG, the second curved portion 45b of the first block insulating film 45, and the second curved portion 46b of the second block insulating film 46. Similarly, the second covering portion 47b at the end portion in the −Y direction is also in contact with the insulating dividing portion 70 and a portion of the tunnel insulating film 63.

The third block insulating film 47 is formed in the Z direction along the boundary between the interlayer insulating films 32 and the word line WL between them, as illustrated in FIG. 3, for example, and is disposed on the side surface side, the upper surface side, and the lower surface side of the floating gate electrode FG with the block insulating films 45 and 46 interposed therebetween. However, instead of the above configuration, the third block insulating film 47 may cover only the side surface side of the floating gate electrode FG, similarly to the block insulating films 45 and 46. The third block insulating film 47 is made of, for example, silicon oxide.

The block insulating films 45, 46, and 47 have a characteristic shape in the cross-sectional structure illustrated in FIG. 3 and have a characteristic relationship in the thickness of each film in the cross-section illustrated in FIG. 3.

In FIG. 3, the third block insulating film 47 formed between the upper and lower interlayer insulating films 32 has a recess portion 47D which is of a convex shape on the word line WL side and of a concave shape on the semiconductor pillar 60 side. The second block insulating film 46 having a uniform thickness is formed in the cross section illustrated in FIG. 3 so as to cover the bottom of the recess portion 47D with a predetermined thickness. The length in the Z direction of the second block insulating film 46 in the recess portion 47D is substantially equal to the total thickness of the word line WL and the barrier metal film BM along the Z direction. The first block insulating film 45 having a cross-sectional shape that is in contact with the side surface, the upper surface, and the lower surface of the floating gate electrode FG is formed inside the recess portion 47D. The first block insulating film 45 has a central portion 45A in contact with the side surface of the floating gate electrode FG. The first block insulating film 45 has a projecting portion 45B in contact with the upper surface of the floating gate electrode FG. The first block insulating film 45 has a projecting portion 45C in contact with the lower surface of the floating gate electrode FG. The projecting portion 45B projects from the end portion of the central portion 45A in the +Z direction toward the semiconductor pillar 60. The projecting portion 45C projects from the end portion of the central portion 45A in the −Z direction toward the semiconductor pillar 60 side.

The first block insulating film 45 is formed of, for example, SiN, SiON, a stacked film of SiO/SiON, or a stacked film of SiO/SiN.

In FIG. 3, the length in the Z direction of the first block insulating film 45 is shorter than the length in the Z direction of the second block insulating film 46. Therefore, in the recess portion 47D, a space is formed above and below the first block insulating film 45 in the Z direction, and the fourth block insulating film 48 is formed above and below so as to fill the space. The width in the Y direction of the fourth block insulating film 48 is equal to the Y direction thickness of a portion of the first block insulating film 45 where the projecting portion 45A is provided. The fourth block insulating film 48 is made of, for example, silicon oxide. The fourth block insulating film 48 is preferably made of a low dielectric constant material. The fourth block insulating film 48 may be replaced with a cavity (a so-called air gap) filled only with a gas (e.g., air).

In the present disclosure, the low dielectric constant material means a low dielectric constant material such as $SiO_2$ or air, and the high dielectric constant material means a material with a relative dielectric constant that is equal to or higher than the relative dielectric constant of a silicon nitride film (SiN film). The relative dielectric constant of a $SiO_2$ film ideally represents 3.9 to 4.0, but may not fall within the range depending on the conditions. The relative dielectric constant of silicon nitride illustrates 7.0. As the high dielectric constant material, silicon nitride (SiN), hafnium oxide (HfO), hafnium silicate ($HfSiO_x$) or the like may be adopted. The high dielectric constant material may be another High-k such as $ZrO_x$, $HfZrO_x$, $AlO_x$, $HfAlO_x$, or $YO_x$.

<2.4. Semiconductor Pillar>

Next, the semiconductor pillar 60 will be described. As illustrated in FIG. 2, the semiconductor pillar 60 is provided between the first word line WLA and the second word line WLB. The semiconductor pillar 60 includes, for example, a channel 61, a core insulating portion 62, and a tunnel insulating film 63.

The channel 61 extends in the Z direction so as to extend over the entire length (or entire height) in the Z direction of the semiconductor pillar 60. The lower end of the channel 61 is connected to the source line SL through the upper insulating film 23 of the lower structure 20. The upper end of the channel is connected to the bit line BL via the contact 91. The channel 61 is made of a semiconductor material such as amorphous silicon (a-Si). However, the channel 61 may be made of, for example, polysilicon partially doped with impurities. The impurities contained in the channel 61 are, for example, any one selected from the group consisting of: carbon, phosphorus, boron, and germanium. In the channel 61, for example, when electrons are injected into the floating gate electrode FG or when electrons injected into the floating gate electrode FG are removed from the floating gate electrode FG, a current flows between the source line SL and the bit line BL.

As illustrated in FIG. 2, the channel 61 is formed in a ring shape (e.g., a rectangular ring shape having rounded corners long in the X direction) between the first word line WLA and the second word line WLB. The channel 61 includes a first channel 61A located on the −X direction side in the semiconductor pillar 60 and a second channel 61B located on the +X direction side in the semiconductor pillar 60. The first and second channels 61A and 61B are adjacent to each other in the X direction and extend in the Z direction.

The core insulating portion 62 is provided closer to the center of the semiconductor pillar 60 than the channel 61 in the X and Y directions. For example, the core insulating portion 62 is provided on the inner peripheral surface of the channel 61. The core insulating portion 62 extends in the Z direction so as to extend over the entire length (or entire height) in the Z direction of the semiconductor pillar 60. The core insulating portion 62 is made of, for example, silicon oxide (SiO), but may have voids.

The tunnel insulating film 63 is provided at least along the side surface in the −X direction and the side surface in the +X direction of the channel 61. The tunnel insulating film 63 includes a first tunnel insulating film 63A located on the −X direction side in the semiconductor pillar 60 and a second tunnel insulating film 63B located on the +X direction side in the semiconductor pillar 60. The first tunnel insulating film 63A is provided between the first floating gate electrode FGA and the first channel 61A. The second tunnel insulating film 63B is provided between the second floating gate electrode FGB and the second channel 61B.

The tunnel insulating film 63 is formed in a ring shape (e.g., a rectangular ring shape having rounded corners long in the X direction) surrounding the −X direction side surface, the +X direction side surface, the −Y direction side surface, and the +Y direction side surface of the channel 61. The tunnel insulating film 63 extends in the Z direction so as to extend over, for example, the entire length in the Z direction of the semiconductor pillar 60.

With the configuration illustrated in FIG. 2, a first cell structure MCA capable of storing charges is formed around the first semiconductor pillar 60A by the first and second floating gate electrodes FGA and FGB, the first and second block insulating films 41A and 41B, and the first and second tunnel insulating films 63A and 63B corresponding to the first semiconductor pillar 60A.

Similarly, a second cell structure MCB capable of storing charges is formed around the second semiconductor pillar 60B by the first and second floating gate electrodes FGA and FGB, the first and second block insulating films 41A and 41B, and the first and second tunnel insulating films 63A and 63B corresponding to the second semiconductor pillar 60B. The second cell structure MCB is adjacent to the first cell structure MCA in the −Y direction.

<2.5. Insulating Dividing Portion>

Next, the insulating dividing portion 70 will be described. As illustrated in FIG. 2, the insulating dividing portion 70 is provided in the stacked body 30 and divides the first word line WLA and the second word line WLB.

<2.5.1. First Insulating Portion>

A first insulating portion 71 will be described. As illustrated in FIG. 2, the first insulating portion 71 is provided between the plurality of semiconductor pillars 60 in the Y direction, and extends between the pillars 60 in the Y direction. The first insulating portion 71 is provided between the first word line WLA and the second word line WLB in the X direction, and divides the first word line WLA and the second word line WLB. Further, the first insulating portion 71 is provided between the first floating gate electrode FGA and the second floating gate electrode FGB in the X direction, and divides the first floating gate electrode FGA and the second floating gate electrode FGB.

Specifically, the first insulating portion 71 has, for example, a first portion 71a, a second portion 71b, and a third portion 71c. As illustrated in FIG. 2, the first portion 71a is provided in the X direction between the second covering portion 47b of the third block insulating film 47 on the −X side of the first cell structure MCA and the second covering portion 47b of the third block insulating film 47 on the +X side of the first cell structure MCA. The second portion 71b is provided in the X direction between the second covering portion 47b of the third block insulating film 47 on the −X side of the second cell structure MCB and the second covering portion 47b of the third block insulating film 47 on the +X side of the second cell structure MCB. The third portion 71c extends in the Y direction between the first portion 71a and the second portion 71b, and connects the first portion 71a and the second portion 71b. The first insulating portion 71 and the semiconductor pillar 60 to electrically insulate the first floating gate electrode FGA and the second floating gate electrode FGB.

The first insulating portion 71 extends along the Z direction so as to extend over the entire length in the Z direction of the pillar 60.

As illustrated in FIG. 2, the semiconductor pillar 60 and the first insulating portion 71 are alternately provided in the Y direction. In other words, the first insulating portion 71 is provided separately on both sides of the semiconductor pillar 60 in the Y direction.

The first insulating portion 71 and the semiconductor pillar 60 to electrically insulate the first word line WLA and the second word line WLB. The first insulating portion 71 extends linearly in the Y direction between the tunnel insulating film 63 of the first cell structure MCA and the tunnel insulating film 63 of the second cell structure MCB, and is in contact with each of the tunnel insulating film 63 of the first cell structure MCA and the tunnel insulating film 63 of the second cell structure MCB. The first insulating portion 71 is made of, for example, an insulating material such as silicon oxide ($SiO_2$).

<Comparison Structure>

Next, the structure of a semiconductor storage device illustrated in FIGS. 4 and 5 will be described for comparison with the semiconductor storage device 1 having the structure illustrated in FIGS. 1 to 3. In contrast to the semiconductor storage device 1 illustrated in FIGS. 2 and 3, FIGS. 4 and 5 illustrate a structure for comparison in which the block insulating films formed in the first cell structure MCA and the second cell structure MCB are different.

Figure 4:
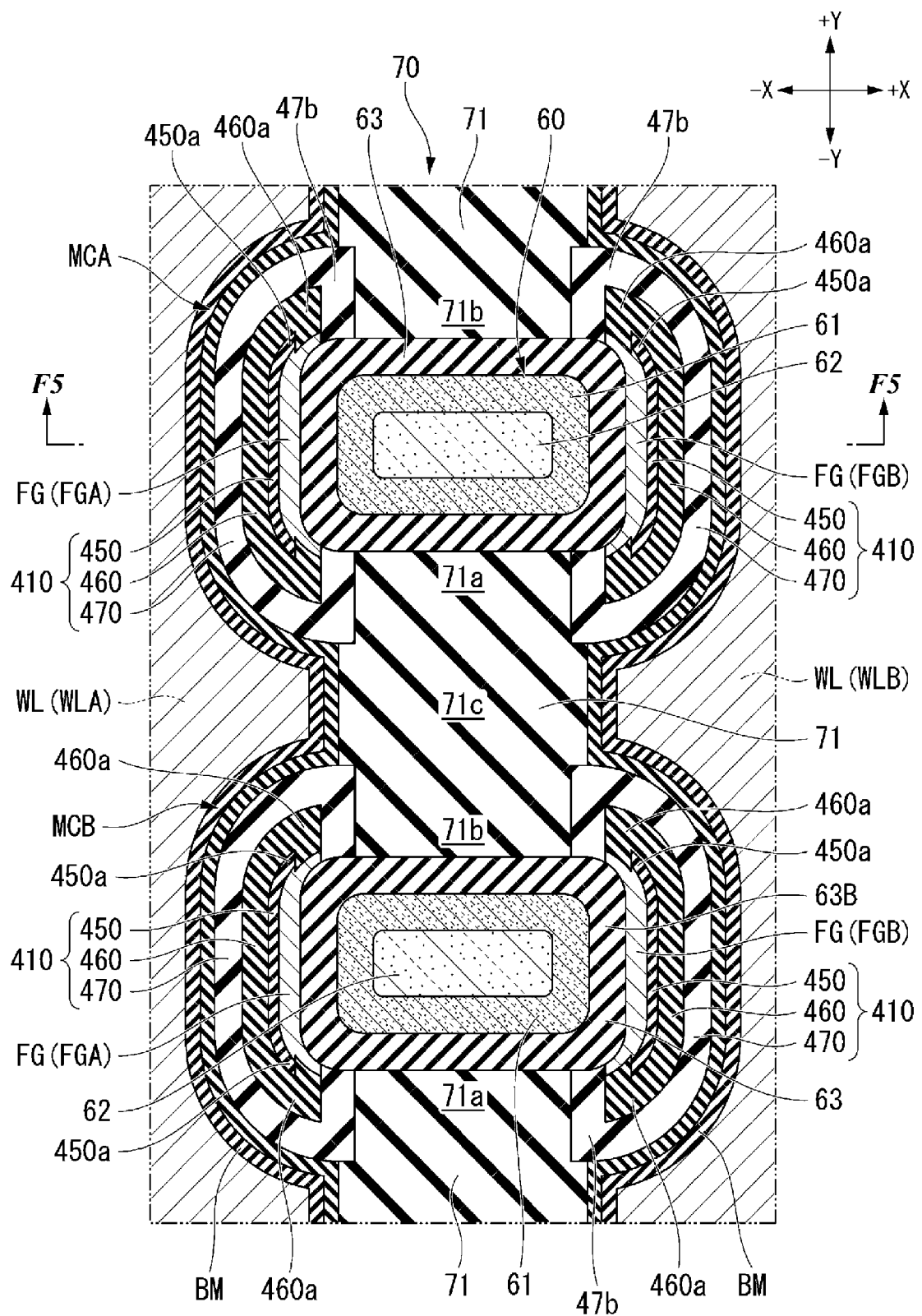
FIG. 4 is a cross-sectional view illustrating a semiconductor storage device of a comparison example.
Figure 5:
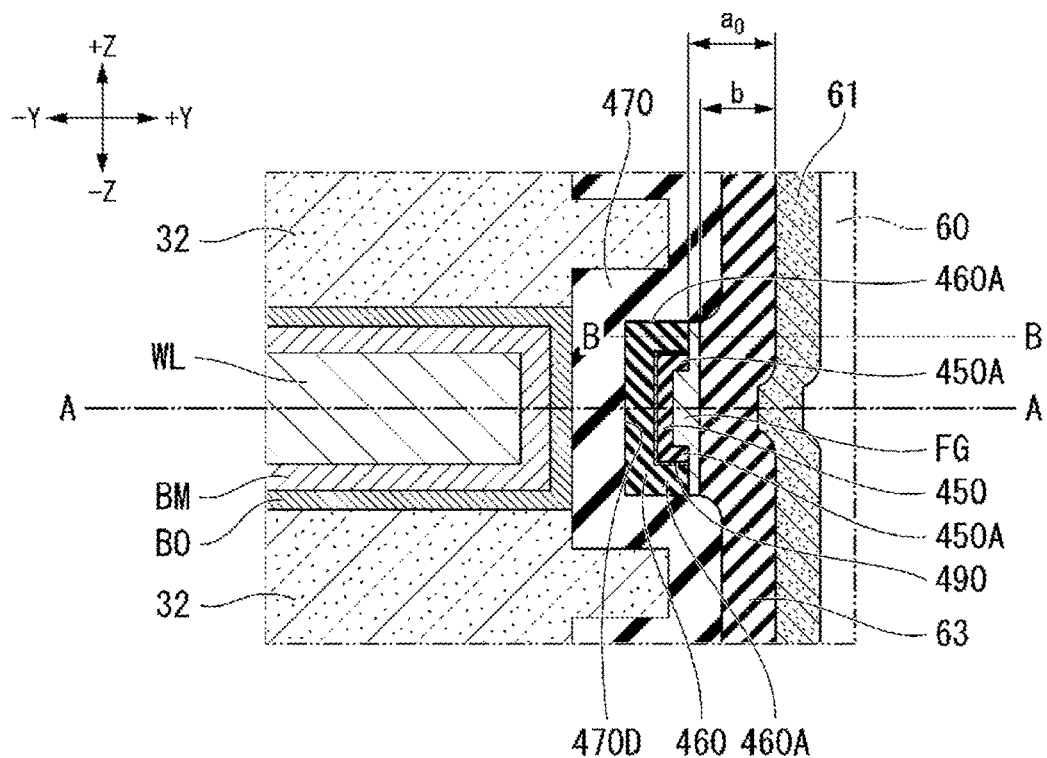
FIG. 5 is a cross-sectional view illustrating another portion of a semiconductor storage device of a comparison example.

The structure illustrated in FIGS. 4 and 5 has a first block insulating film 450, a second block insulating film 460, and a third block insulating film 470 around the floating gate electrode FG. The other structure is the same as the structure of the semiconductor storage device illustrated in FIGS. 1 to 3. As illustrated in FIG. 5, the first block insulating film 450 and the second block insulating film 460 are formed inside a recess portion 470D formed by the third block insulating film 470. In this example, the floating electrode FG is formed in a dish shape so as to be located at an opening of the recess portion 470D. A projecting portion 450A projecting toward the semiconductor pillar 60 is formed at both ends of the first block insulating film 450 in the Z direction. A projecting portion 460A projecting toward the semiconductor pillar 60 is formed on both ends of the second block insulating film 460 in the Z direction. An extremely thin metal layer 490 is interposed at an interface between the first block insulating film 450 and the second block insulating film 460.

In the cross section illustrated in FIG. 5, a line A passes through an intermediate point in the thickness direction of the word line WL along the Z direction. In the structure of FIG. 5 along the line A, the third block insulating film 470, the second block insulating film 460, the metal layer 490, the first block insulating film 450, the floating gate electrode FG, the tunnel insulating film 63, and the channel 61 are arranged in this order.

In FIG. 5, a line B is drawn at a position displaced from the line A in the +Z direction and is parallel to the line A along the position of the projecting portion 460A of the second block insulating film 460. In the structure of FIG. 5, along the line B, the third block insulating film 470, the second block insulating film 460, the floating gate electrode FG, the tunnel insulating film 63, and the channel 61 are arranged in this order.

In consideration of a cell structure in which charges are stored in the floating gate electrode FG, the structure illustrated in FIG. 5 has a structural difference in the central portion side in the Z direction and the both end portion sides in the Z direction between the first block insulating film 450 and the second block insulating film 460.

Further, as illustrated in FIG. 4, both end portions 460a of the second block insulating film 460 in the Z direction extend so as to cover both end portions 450a of the first block insulating film 450 in the Z direction, and are in contact with the end portion of the floating gate electrode FG in the Z direction.

As illustrated in FIGS. 4 and 5, the end portion side of the cell structure has a structure in which the second block insulating film 460 made of a High-k material is in contact with the floating gate electrode FG, and it is estimated that a leak current will become intense at the end portion side. That is, in the cell structure illustrated in FIGS. 4 and 5, the characteristic limiting rate of the cell structure due to the leak current on the end portion side becomes larger. In certain cases, charge transfer occurs at an unnecessary position, and the writing characteristics tend to be saturated.

In the structure illustrated in FIGS. 2 and 3, since the first block insulating film 45 having a low dielectric constant is disposed between the floating gate electrode FG and the second block insulating film 46, it is possible to prevent a leak current at both end sides of the second block insulating film 46 in the Z direction. In the cross section of FIG. 4, the second block insulating film 460 made of the High-k material is in contact with a portion of the floating gate electrode FG. In contrast, in the structure of FIG. 2, both end portions of the second block insulating film 46 in the Y direction are covered with the second covering portion 47b, and the end portions of the floating gate electrode FG near both end portions of the second block insulating film 46 in the Y direction are also covered with the second covering portion 47b. Therefore, it is possible to prevent a leak current at both end portions of the floating gate electrode FG in the Y direction. Accordingly, the semiconductor storage device 1 illustrated in FIGS. 1 to 3 has the writing characteristics superior to those of the structures illustrated in FIGS. 4 and 5.

In the structure illustrated in FIG. 3, the shortest distance $a_0$ between the second block insulating film 46 and the channel 61 is longer than the shortest distance b between the floating gate electrode FG and the semiconductor pillar 60. That is, there is the relationship of $a_0>b$. In contrast, in the structure illustrated in FIG. 5, the projecting portion 460A of the second block insulating film 460 has the relationship of $a_0>b$, but the difference between $a_0$ and b is smaller than that in the structure of FIG. 3.

Therefore, in the structure of FIG. 5, the difference in cell structure between the central portion of the cell having no projecting portion 460A and the end portion of the cell having the projecting portion 460A becomes larger as described above. In the structure of FIG. 3, it is possible to obtain a cell structure superior to the cell structure illustrated in FIG. 5 by increasing the difference between both with the relationship of $a_0>b$ as described above. The difference between $a_0$ and b is preferably large, but is preferably about ½ or more of the thickness of the floating gate electrode FG in the Y direction. This relationship will be described in greater detail in conjunction with a third embodiment to be described later.

In addition, in the tunnel insulating film 63 and the channel 61 illustrated in the sectional structure illustrated in FIG. 3, a recess portion is drawn on the side opposite to the recess portion 47D side. This recess portion may not be formed depending on the film forming conditions such as the depth and size of the recess portion 47D, the film thickness of the tunnel insulating film 63, and the film thickness of the channel 61. For example, in certain cases, a recess portion may not be formed as indicated by a two-dot chain line H in FIG. 3, and conversely, a convex shape may be generated in the right of the two-dot chain line H. The recess portions of the tunnel insulating film 63 and the channel 61 illustrated in FIG. 3 are examples and are not limited to the shape illustrated in FIG. 3. In FIGS. 5 to 7, 15 to 17, 25 and 26, the tunnel insulating film 63 and the channel 61 are both drawn to have recess portions. However, these recess portions need not necessarily be provided, and may have a structure that is convex to the right side.

Second Embodiment

Next, a second embodiment will be described. The second embodiment is different from the first embodiment in the length in the Z direction of the second block insulating film. The configuration of the second embodiment is the same as that of the first embodiment except for the configuration to be described below.

Figure 6:
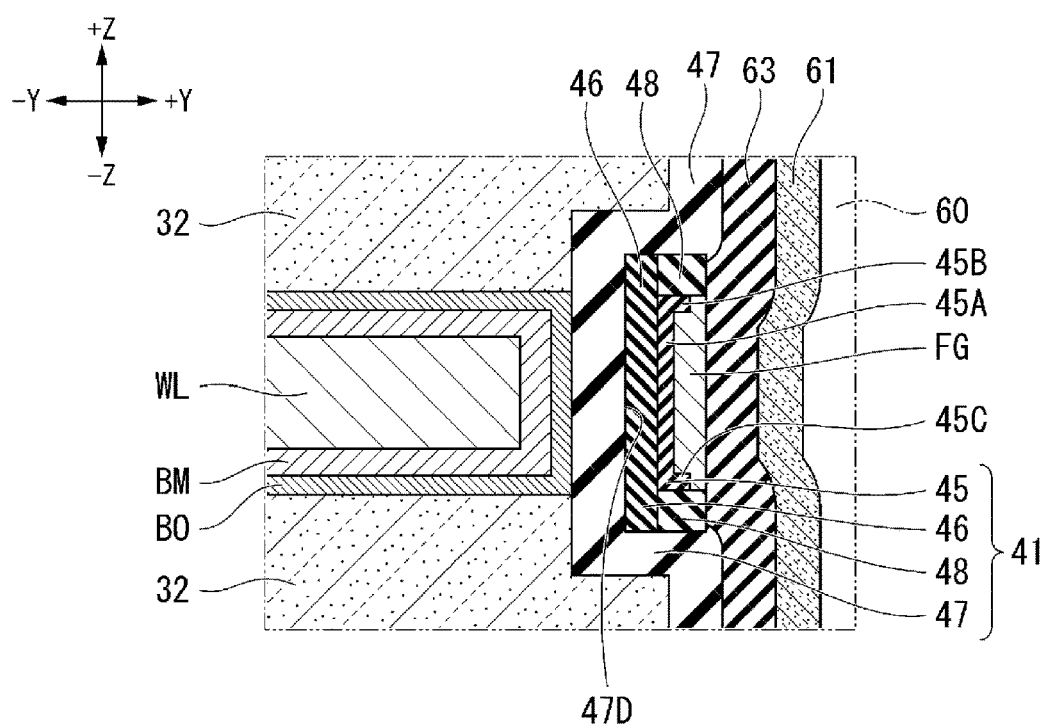
FIG. 6 is a cross-sectional view illustrating a semiconductor storage device according to a second embodiment.

FIG. 6 is a cross-sectional view illustrating the structure around the floating gate electrode in the semiconductor storage device 1 according to the second embodiment. In the present embodiment, the recess portion 47D is formed by the third block insulating film 47 between the word line WL and the floating gate electrode FG, as in the first embodiment. In the second embodiment, the inner width in the Z direction of the recess portion 47D is different from that in the first embodiment. The inner width in the Z direction of the recess portion 47D of the present embodiment is slightly larger than the total width in the Z direction of the word line WL, the barrier metal film BM, and the block film BO.

The second block insulating film 46 having a uniform thickness is formed in the cross section illustrated in FIG. 6 so as to cover the bottom of the recess portion 47D with a predetermined thickness. The length in the Z direction of the second block insulating film 46 is slightly longer than the total width in the Z direction of the word line WL, the barrier metal film BM, and the block film BO. The length in the Z direction of the first block insulating film 45 is equal to or substantially equal to the total width in the Z direction of the word line WL, the barrier metal film BM, and the block film BO. The length in the Z direction of the floating gate electrode FG is equal to the length in the Z direction of the first block insulating film 45.

In the structure of the second embodiment, similar to the semiconductor storage device 1 according to the first embodiment, the fourth block insulating films 48 are arranged in both end portions of the second block insulating film 46 in the Z direction.

The shortest distance $a_0$ between the second block insulating film 46 and the channel 61 is longer than the shortest distance b between the floating gate electrode FG and the semiconductor pillar 60. That is, there is the relationship of $a_0>b$. Therefore, unlike the structure illustrated in FIG. 5 in which the projecting portion 460A is provided on the second block insulating film 460, the structure of the second embodiment can also prevent leak current in the both end sides of the second block insulating film 46 in the Z direction.

Further, in the second embodiment, as in the first embodiment, the presence of the second covering portion 47b of the third block insulating film 47 prevents contact between the second block insulating film 46 and the floating gate electrode FG. Therefore, it is possible to prevent charge transfer from the floating gate electrode FG to the second block insulating film 46 side, thereby providing a cell structure with good write characteristics. Other operations and effects are similar to those of the semiconductor storage device 1 of the first embodiment.

In the structure of the second embodiment, with respect to the length (or thickness) in the Z direction of the word line WL, the inner width of the recess portion 47D is used to ensure that the length in the Z direction of the second block insulating film 46 and the length in the Z direction of the floating gate electrode FG are sufficiently large.

In addition, the length in the Z direction of the floating gate electrode FG of the cross section illustrated in FIG. 3 according to the first embodiment is shorter than the length in the Z direction of the floating gate electrode FG of the cross section illustrated in FIG. 5 for comparison. In the case of the structure illustrated in FIG. 3, the controllability of a gate due to a short channel is expected to be lower than that of the structure illustrated in FIG. 5. In the second embodiment, the length in the Z direction of the second block insulating film 46 and the length in the Z direction of the floating gate electrode FG are secured to be as large as possible to increase the gate width, thereby preventing deterioration of the controllability of the gate.

Third Embodiment

Next, a third embodiment will be described. The third embodiment is different from the first embodiment in that the second block insulating film has a projecting portion at both end portions thereof in the Z direction. The configuration of the third embodiment is the same as that of the first embodiment except for the configuration to be described below.

Figure 7:
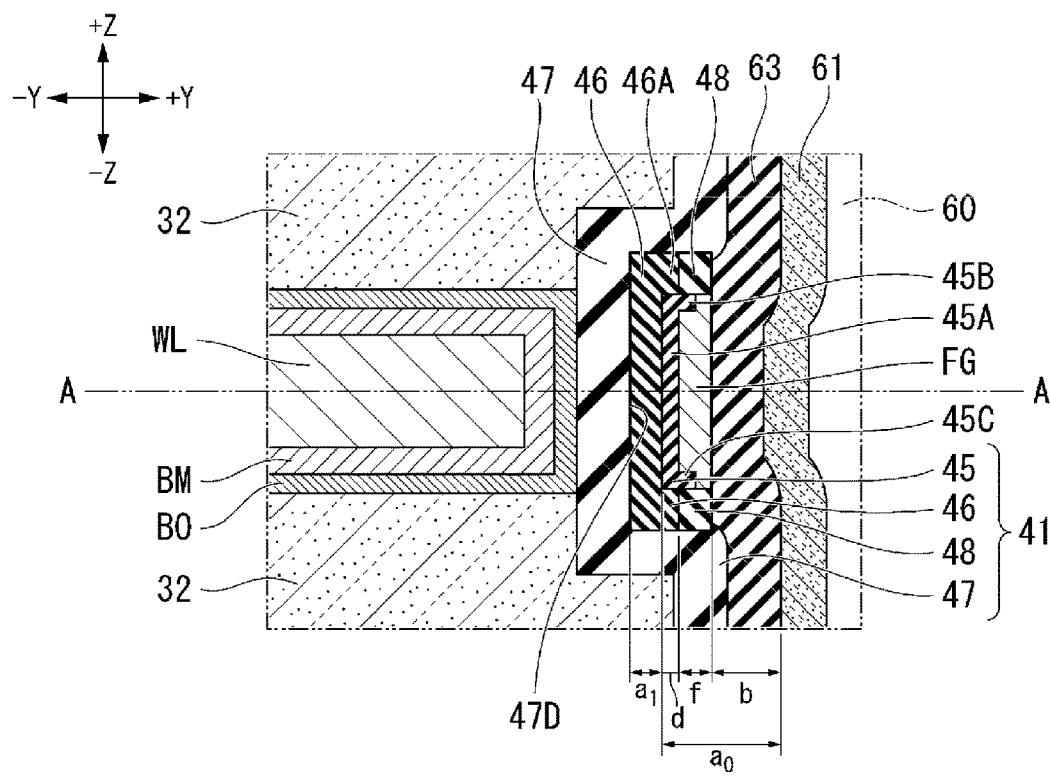
FIG. 7 is a cross-sectional view illustrating a semiconductor storage device according to a third embodiment.

FIG. 7 is a cross-sectional view illustrating the semiconductor storage device 1 according to the third embodiment. In the present embodiment, the inner width in the Z direction of the recess portion 47D formed in the third block insulating film 47 is different from that in the first embodiment. The inner width in the Z direction of the recess portion 47D of the present embodiment is slightly larger than the total width in the Z direction of the word line WL, the barrier metal film BM, and the block film BO. The second block insulating film 46 covers the bottom of the recess portion 47D with a predetermined thickness. A projecting portion 46A projecting toward the semiconductor pillar 60 is formed at both end portions of the second block insulating film 46 in the Z direction. The Y direction thickness of the second block insulating film 46 in a portion where the projecting portion 46A is formed is about ½ of the depth of the recess portion 47D. The length in the Z direction of the second block insulating film 46 is slightly larger than the total width in the Z direction of the word line WL, the barrier metal film BM, and the block film BO. The length in the Z direction of the first block insulating film 45 is equal to or substantially equal to the total width in the Z direction of the word line WL, the barrier metal film BM, and the block film BO. The length in the Z direction of the floating gate electrode FG is equal to the length in the Z direction of the first block insulating film 45.

In the structure of the third embodiment, similar to the semiconductor storage device 1 according to the first embodiment, the fourth block insulating films 48 are arranged at both end portions of the second block insulating film 46 in the Z direction.

The shortest distance $a_0$ between the second block insulating film 46 and the channel 61 is longer than the shortest distance b between the floating gate electrode FG and the semiconductor pillar 60. That is, there is the relationship of $a_0 > b$. Therefore, unlike the structure in which the projecting portion 460A is provided on the second block insulating film 460 illustrated in FIG. 5, the structure of the third embodiment can also prevent a leak current at both end sides of the second block insulating film 46 in the Z direction.

In addition, in the third embodiment, as in the first embodiment, the presence of the second covering portion 47b of the third block insulating film 47 prevents contact between the second block insulating film 46 and the floating gate electrode FG. Therefore, in the structure according to the third embodiment, it is possible to prevent charge transfer from the floating gate electrode FG to the second block insulating film side, thereby providing a cell structure with good write characteristics. Other operations and effects are similar to those of the semiconductor storage device 1 of the first embodiment.

In the structure of the third embodiment, the second block insulating film 46 has the projecting portion 46A at both end portions thereof in the Z direction. However, the inner width of the recess portion 47D is used to ensure that the length in the Z direction of the second block insulating film 46 and the length in the Z direction of the floating gate electrode FG are sufficiently larger than the length (or thickness) in the Z direction of the word line WL.

In addition, the length in the Z direction of the floating gate electrode FG of the cross section illustrated in FIG. 3 according to the first embodiment is shorter than the length in the Z direction of the floating gate electrode FG of the cross section illustrated in FIG. 5 for comparison. In the case of the structure illustrated in FIG. 3, the controllability of a gate due to a short channel is expected to be lower than that of the structure illustrated in FIG. 5. In the third embodiment, the length in the Z direction of the second block insulating film 46 and the length in the Z direction of the floating gate electrode FG are secured to be as large as possible to increase the gate width, thereby preventing deterioration of the controllability of the gate.

<Dimensional Relationship>

In the cross section illustrated in FIG. 7, the shortest distance (i.e., the distance separated in the Y direction) $a_0$ between the second block insulating film 46 and the channel 61 is longer than the shortest distance b between the floating gate electrode FG and the semiconductor pillar 60. That is, there is the relationship of $a_0 > b$.

In FIG. 7, a line A extends in the Y direction through the midpoint in the thickness direction of the word line WL along the Z direction. It is assumed that the thickness of the second block insulating film along the line A is $a_1$, the thickness of the first block insulating film 45 along the line A is d, and the thickness of the floating gate electrode FG along the line A is f. It is desirable that the maximum value of the film thickness of the second insulating film along the orientation parallel to the line A is smaller than $a+d+(½)f$.

For example, when the projecting portions 46a are formed above and below the second block insulating film 46 as illustrated in FIG. 7, the projecting portions 46a have the following relationship. This means that the length (or thickness) in the Y direction of the second block insulating film 46 in a portion where the projecting portion 46A is provided is smaller than $a_1+d+(½)f$. This relationship indicates that there is a limit in the length in the Y direction of the projecting portion 46A even when the projecting portion 46A is provided on the second block insulating film 46.

<3. Manufacturing Method>

Fourth Embodiment

Next, a method of manufacturing a semiconductor storage device will be described. Steps other than those to be described below are described in, for example, US-A-2016-0336336, JP-A-2019-043121, and JP-A-2019-151439. These documents are incorporated herein by reference in their entirety.

The usual method described in each of the above documents is applied to the step of forming an ONON stacked body by alternately stacking a required number of silicon oxide films and silicon nitride films on a silicon substrate. The usual method described in each of the above documents is applied to the step of forming a required number of memory trenches extending in the Y direction of the stacked body at predetermined intervals in the X direction and periodically arranging the memory trenches. The memory trenches are provided by penetrating the stacked body in the Z direction. Next, the usual method described in each of the above documents is also applied to the step of depositing silicon oxide in the memory trench to form an insulating member in the memory trench, and forming a memory hole in the memory trench. The memory hole divides the insulating member in the Y direction.

Next, the silicon nitride film is isotropically etched through the memory hole to recess the silicon nitride. Through this process, a space reaching the memory hole is formed in a portion between the silicon oxide films adjacent to each other in the Z direction. The usual method described in each of the above documents is also applied to this step.

After the above steps, the exposed portion of the silicon nitride film on the inner side of the space is oxidized by a method such as heat treatment in an oxidizing atmosphere, or the third block insulating film is formed by a method of forming a silicon oxide film, etc.

Figure 8:
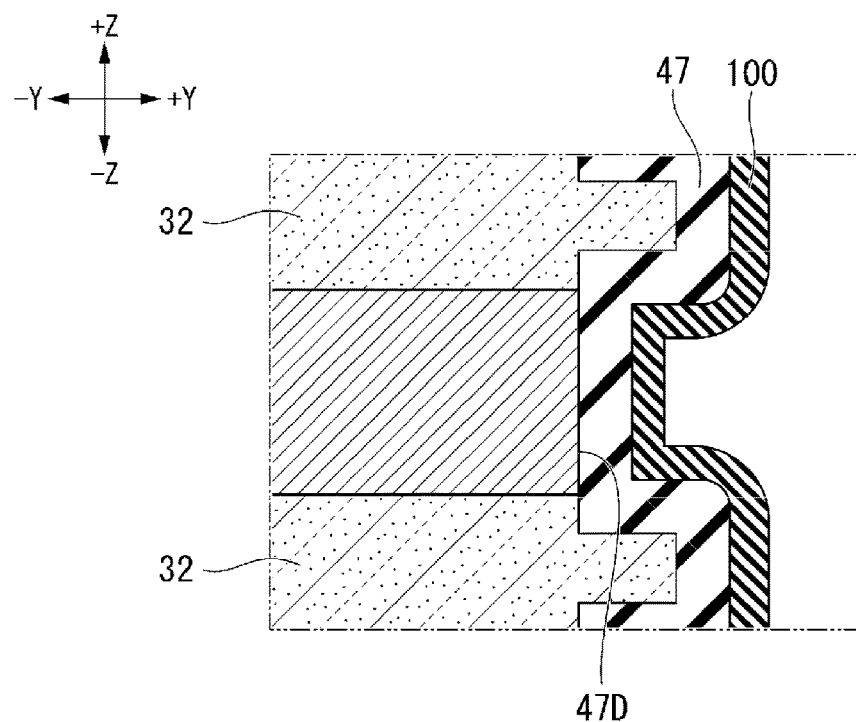
FIG. 8-13 are cross-sectional views illustrating aspects of a method of manufacturing a semiconductor storage device according to a fourth embodiment.

FIG. 8 illustrates a state in which the third block insulating film 47 is formed and an insulating film 100 for forming the second block insulating film 46 is formed inside thereof. In the cross section illustrated in FIG. 8, the word lines WL between the interlayer insulating films 32 arranged above and below in the Z direction are omitted, and only the cross-sectional structure of the floating gate electrode formed in the following steps and the peripheral portion thereof are illustrated.

FIGS. 8 to 15 are cross-sectional views illustrating the process of manufacturing a semiconductor storage device according to a fourth embodiment.

In the state illustrated in FIG. 8, the recess portion 47D formed of the third block insulating film 47 is adjacent to a word line forming portion between the interlayer insulating films 32 arranged vertically in the Z direction. Further, the insulating film 100 made of a high dielectric constant material for forming the second block insulating film 46 is formed on the third block insulating film 47.

Figure 9:
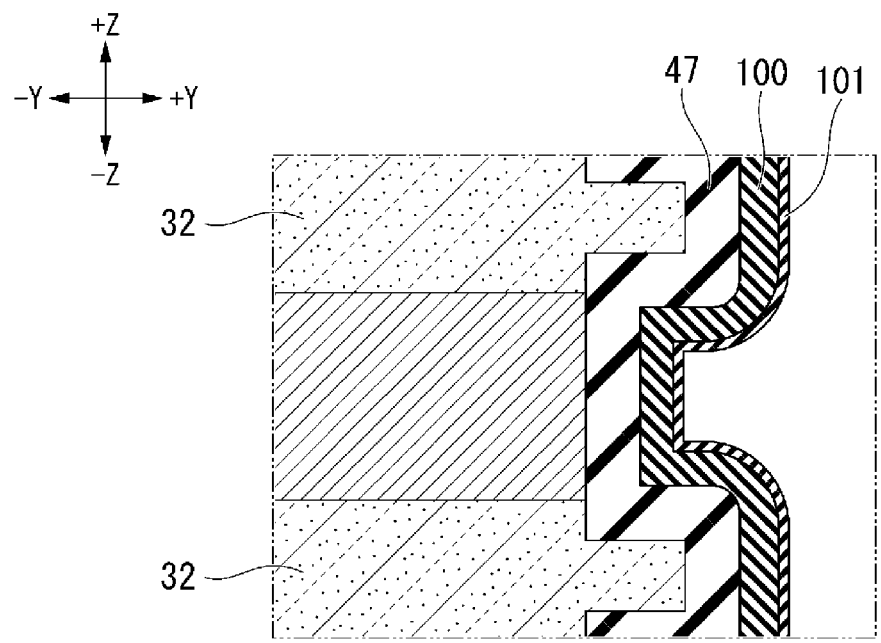

Next, as illustrated in FIG. 9, an insulating film 101 for forming the first block insulating film 45 is formed on the insulating film 100.

Figure 10:
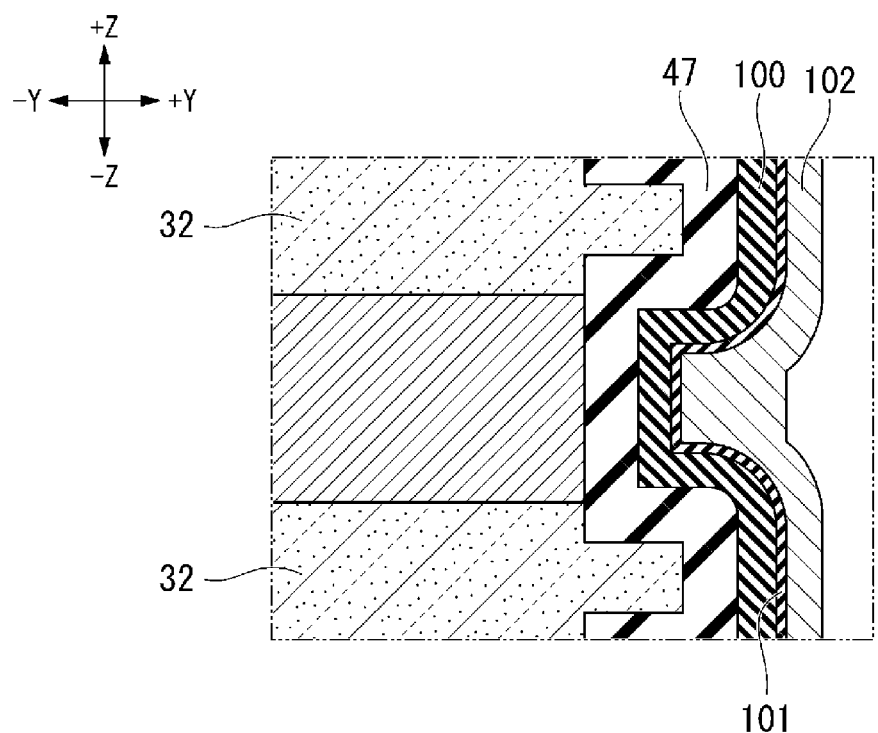

Next, as illustrated in FIG. 10, a conductive film 102 formed of a polysilicon film for forming the floating gate electrode FG is formed on the insulating film 101.

Figure 11:
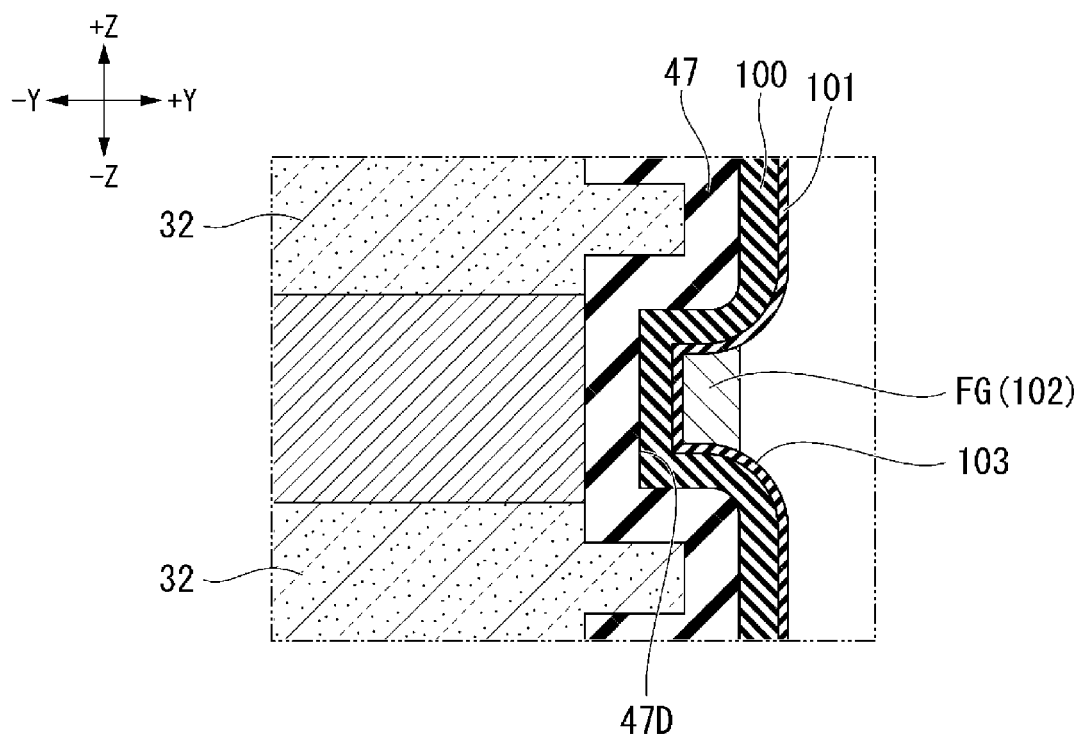

Next, the conductive film 102 is subjected to an etching process so that the conductive layer 102 having a predetermined thickness is left only inside the recess portion 47D, as illustrated in FIG. 11. The third block insulating film 47, the insulating film 100 for forming the second block insulating film, and the insulating film 101 for forming the first block insulating film are stacked inside the recess portion 47D in this order from the bottom side.

With respect to the insulating film 101 on both sides of the recess portion 47D in the Z direction, a portion of the conductive film 102 remaining inside of the recess portion 47D is recessed, and a recess groove 103 is formed outside the conductive film 102. The portion of the conductive film 102 remaining by this processing becomes the floating gate electrode FG.

Figure 12:
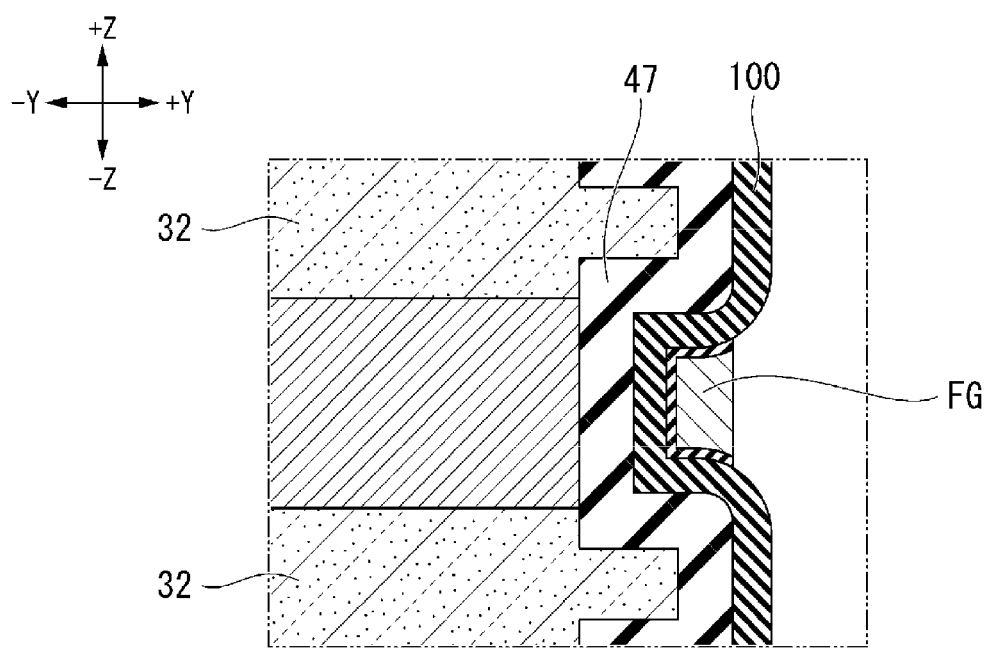
Figure 13:
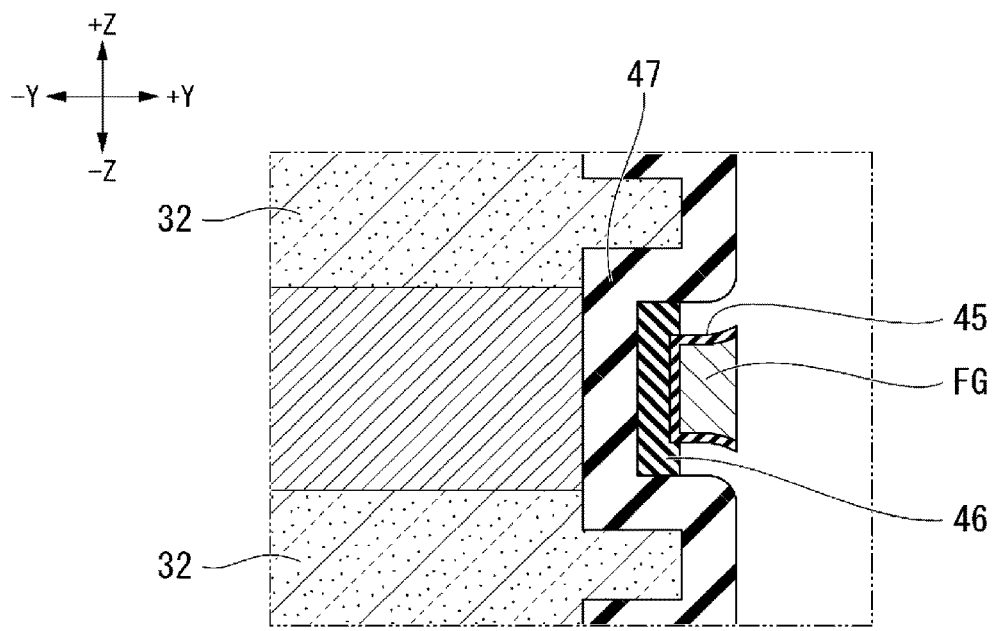

Next, using the floating gate electrode FG as a hard mask, etching is performed to remove only the insulating film 100, so that the insulating film 101 is partially left inside the recess portion 47D, as illustrated in FIGS. 12 and 13. By this processing, the second block insulating film 46 may be formed inside the recess portion 47D.

Figure 14:
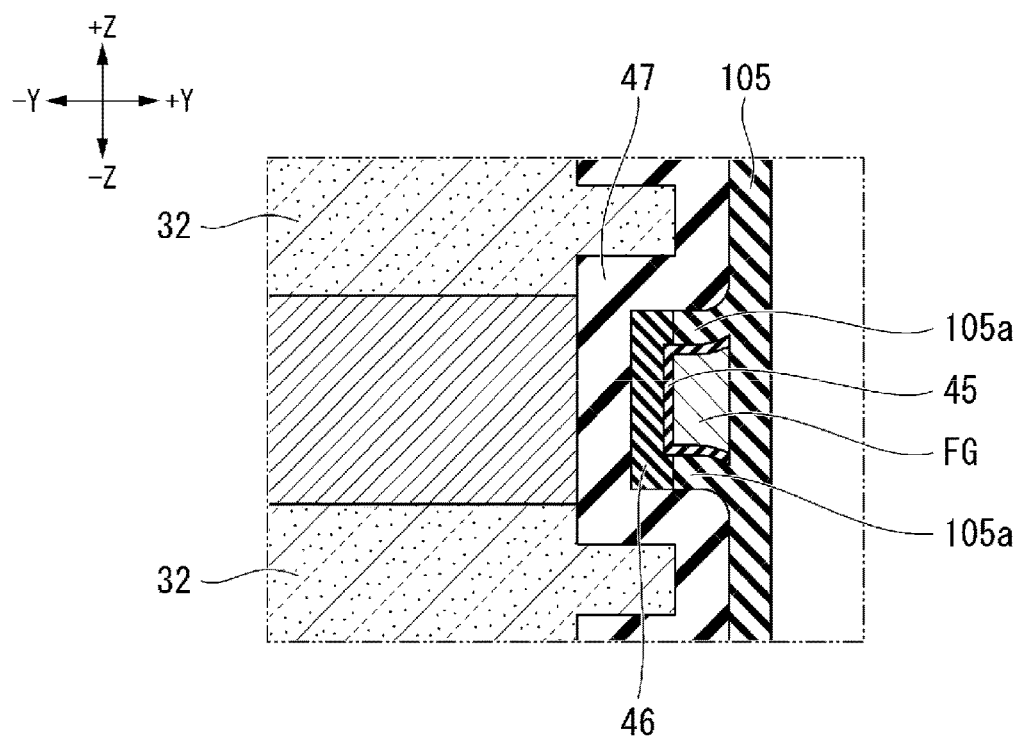
FIG. 14 is a cross-sectional view illustrating a semiconductor storage device according to a fourth embodiment.

Next, an insulating film 105 having a low dielectric constant is formed as illustrated in FIG. 14. This low dielectric constant insulating film 105 may be used as the tunnel insulating film 63. Next, although not illustrated in this instance, the tunnel insulating film 63 is formed, and after the tunnel insulating film 63 is formed, the semiconductor pillar 60 is formed to complete the semiconductor storage device 1.

By the manufacturing method described above, the semiconductor storage device 1 according to the fourth embodiment in which the first block insulating film 45, the second block insulating film 46, and the third block insulating film 47 are disposed between the floating gate electrode FG and the word line as illustrated in FIG. 14 may be manufactured.

In the cross-sectional structure of the semiconductor storage device illustrated in FIG. 14, inside the recess portion 47D on the both sides in the Z direction of the floating gate electrode FG, a projecting portion 105a is formed by extending the insulating film 105 in the −Y direction. The projecting portion 105a extends inside the recess portion 47D so as to contact the first block insulating film 45. The projecting portion 105a is equivalent to the fourth block insulating film in the structure illustrated in FIG. 3. Therefore, the structure of the semiconductor storage device illustrated in FIG. is equivalent to the cross-sectional structure of the semiconductor storage device 1 illustrated in FIG. 3.

Further, in the cross-sectional structure of the semiconductor storage device illustrated in FIG. 14, only the projecting portion 105a may be left and other portions may be removed by etching to form a preferable material again for forming the tunnel insulating film 63 instead of the insulating film 105. This step will be described later.

Fifth Embodiment

Next, a fifth embodiment will be described. The fifth embodiment is different from the first embodiment in the length in the Z direction of the second block insulating film, and the shape of the third block insulating film. The configuration of the fifth embodiment is the same as that of the first embodiment except for the configuration to be described below.

Figure 15:
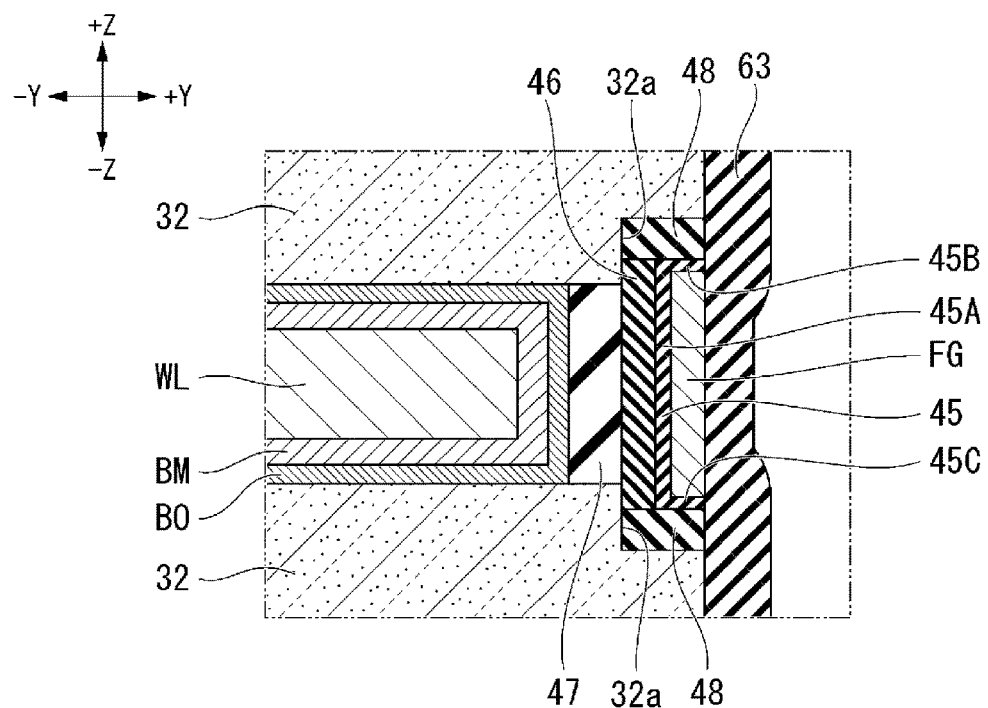
FIG. 15 is a cross-sectional view illustrating a semiconductor storage device according to a fifth embodiment.

FIG. 15 is a cross-sectional view illustrating the structure around the floating gate electrode in the semiconductor storage device according to the fourth embodiment. The cross section illustrated in FIG. 15 is a cross section at the same position as that of FIG. 3 illustrating the cross section of the semiconductor storage device according to the first embodiment. In the fifth embodiment, the structure in which the first block insulating film 45, the second block insulating film 46, the third block insulating film 47, and the fourth block insulating film 48 are provided between the word line WL and the floating gate electrode FG is similar to that of the first embodiment.

In the fifth embodiment, the fourth block insulating film 48 is spaced in the Z direction and partially embedded in the interlayer insulating films 32 provided above and below the word line WL. The third block insulating film 47 is provided on the +Y direction side of the word line WL, and the length thereof in the Z direction of the cross section illustrated in FIG. 15 is equal to or substantially equal to the interval between the upper and lower interlayer insulating films 32. In other words, the length in the Z direction of the third block insulating film 47 is equal to or substantially equal to the Z direction thickness of a region including the word line WL, the barrier metal film BM, and the barrier film BO together.

In FIG. 15, step portions 32a are formed on the upper and lower interlayer insulating films 32 on the +Y side of the third block insulating film 47, and the second block insulating film 46 is formed between the pair of upper and lower step portions 32a.

In FIG. 15, the second block insulating film 46 is in contact with the side surface of the third block insulating film 47 on the +Y side, and the length in the Y direction of the second block insulating film 46 is formed slightly shorter than the length in the Y direction of the third block insulating film 47. The second block insulating film 46 is disposed so that the end portion thereof in the +Z direction is inserted into the upper step portion 32a and the end portion thereof in the −Z direction is inserted into the lower step portion 32a. The Y direction thickness of the second block insulating film 46 is uniform from the bottom to the top in the Z direction.

The length in the Z direction of the first block insulating film 45 is equal to the length in the Z direction of the second block insulating film 46. The projecting portion 45B projecting in the +Y direction is formed at the end portion of the first block insulating film 45 in the +Z direction, the projecting portion 45C is formed at the end portion of the first block insulating film 45 in the +Z direction, and the floating gate electrode FG is disposed between the projecting portions 45B and 45C spaced in the Y direction. In FIG. 15, the right side surface of the first block insulating film 45 on the +Y side is in contact with the left side surface of the floating gate electrode FG on the −Y side. The lower end surface of the projecting portion 45B on the +Z side of the first block insulating film 45 is in contact with the upper surface on the +Z side of the floating gate electrode FG. The upper end surface of the projecting portion 45C on the −Z side of the first block insulating film 45 is in contact with the lower surface on the −Z side of the floating gate electrode FG.

As illustrated in FIG. 15, the end portions of the first block insulating film 45 and the second block insulating film 46 in the +Z direction are arranged on the lower side of the upper step portion 32a. A space is provided between the end portions of the first block insulating film 45 and the second block insulating film 46 in the +Z direction and the inner upper portion of the upper step portion 32a, and the fourth block insulating film 48 is filled in this space. As illustrated in FIG. 15, the end portions of the first block insulating film 45 and the second block insulating film 46 in the −Z direction are arranged on the upper side of the lower step portion 32a. A space is provided between the end portions of the first block insulating film 45 and the second block insulating film 46 in the −Z direction and the inner bottom of the lower step portion 32a. The fourth block insulating film 48 is filled in this space. The first block insulating film 45 and the second block insulating film 46 are sandwiched between the upper and lower fourth block insulating films 48.

The lengths in the Z direction of the first block insulating film 45 and the second block insulating film 46 are slightly larger than the total width in the Z direction of the word line WL, the barrier metal film BM, and the block film BO. The length in the Z direction of the floating gate electrode FG is slightly larger than the total width in the Z direction of the word line WL, the barrier metal film BM, and the block film BO.

In the structure of the fifth embodiment, similar to the semiconductor storage device 1 according to the first embodiment, the fourth block insulating films 48 are arranged in both end portions of the second block insulating film 46 in the Z direction.

The shortest distance $a_0$ between the second block insulating film 46 and the channel 61 is longer than the shortest distance b between the floating gate electrode FG and the semiconductor pillar 60. That is, there is a relationship of $a_0 > b$. Therefore, unlike the structure in which the projecting portion 460A is provided on the second block insulating film 460 illustrated in FIG. 5, the structure of the fifth embodiment can also prevent a leak current in the both end sides of the second block insulating film 46 in the Z direction.

In addition, in the fifth embodiment, as in the first embodiment, the presence of the second covering portion 47b of the third block insulating film 47 prevents contact between the second block insulating film 46 and the floating gate electrode FG. Therefore, in the structure according to the fifth embodiment, it is possible to prevent charge transfer from the floating gate electrode FG to the second block insulating film side, thereby providing a cell structure with good write characteristics. Other operations and effects are similar to those of the semiconductor storage device 1 of the first embodiment.

In the structure of the fifth embodiment, the length in the Z direction of the second block insulating film 46 and the length in the Z direction of the floating gate electrode FG are set to be sufficiently larger than the length (or thickness) in the Z direction of the word line WL.

In the structures of the first to third embodiments described above, even when the recess portion 47D is used to make the length in the Z direction of the floating gate electrode FG as large as possible, there is a limit on the size of the recess portion 47D that may be formed. This is a limit when the method of forming the recess portion 47D forms the third block insulating film 47 from the memory hole side. Since the second block insulating film 46 and the floating gate electrode FG enter the recess portion 47D, the length in the Z direction of the second block insulating film 46 and the length in the Z direction of the floating gate electrode FG are limited to the size of the recess portion 47D. In contrast, in the structure illustrated in FIG. 15, since the step portion 32a is formed in the interlayer insulating film 32, there is no limit on the size in which the recess portion 47D may be formed. For example, by using an oxidized silicon nitride film of the ONON stacked body as a silicon oxide film, the structure illustrated in FIG. 15 may be obtained, which is a structure advantageous for increasing the gate length.

Other operations and effects are the same as those of the semiconductor storage device 1 of the first embodiment.

Sixth Embodiment

Next, a sixth embodiment will be described with reference to FIG. 16. The semiconductor storage device according to the sixth embodiment has a structure similar to that of the semiconductor storage device according to the second embodiment. The configuration of the sixth embodiment is the same as that of the second embodiment except for the configuration to be described below.

The sixth embodiment is characterized in that the first block insulating film 45, the third block insulating film 47, and the tunnel insulating film 63 are all made of the same low dielectric constant material. When the first block insulating film 45, the third block insulating film 47, and the tunnel insulating film 63 are all made of the same low dielectric constant material, the boundaries of these films do not appear when the cross section illustrated in FIG. 16 is taken. However, if the boundary of each film is not drawn in FIG. 16, it is difficult to explain the shape of each film. Therefore, for the sake of convenience, a two-dot chain line is drawn along the boundary portion of each film, and the following description will be given based on the boundary drawn with the two-dot chain line.

Figure 16:
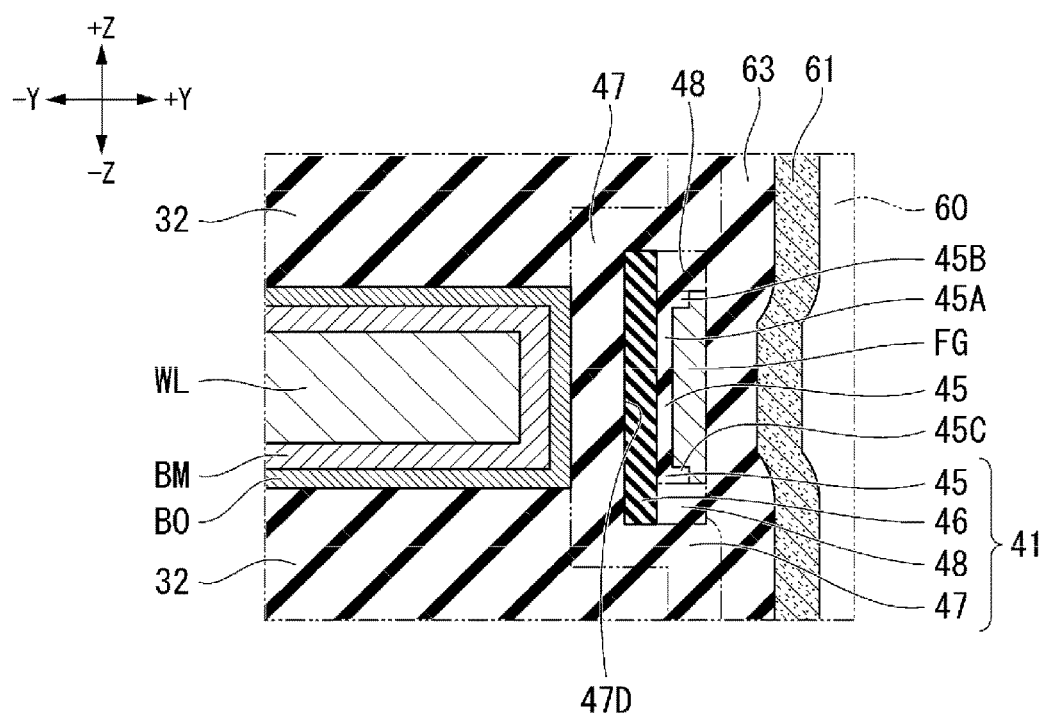
FIG. 16 is a cross-sectional view illustrating a semiconductor storage device according to a sixth embodiment.

When the boundary position is indicated by the two-dot chain line in FIG. 16, the semiconductor storage device of the sixth embodiment is similar to the structure of the second embodiment illustrated in FIG. 6 in that the first block insulating film 45, the third block insulating film 47, and the tunnel insulating film 63 are formed.

In the present embodiment, as in the second embodiment, the recess portion 47D by the third block insulating film 47 is formed between the word line WL and the floating gate electrode FG. The inner width in the Z direction of the recess portion 47D is slightly larger than the total width in the Z direction of the word line WL, the barrier metal film BM, and the block film BO.

The second block insulating film 46 having a uniform thickness is formed in the cross section illustrated in FIG. 16 so as to cover the bottom of the recess portion 47D with a predetermined thickness. The length in the Z direction of the second block insulating film 46 is slightly larger than the total width in the Z direction of the word line WL, the barrier metal film BM, and the block film BO. The length in the Z direction of the first block insulating film 45 is equal to or substantially equal to the total width in the Z direction of the word line WL, the barrier metal film BM, and the block film BO. The length in the Z direction of the floating gate electrode FG is equal to the length in the Z direction of the first block insulating film 45.

As illustrated in FIG. 16, in the sixth embodiment, since the interlayer insulating film 32 and the third block insulating film 47 are made of the same material, the films are integrated and the boundary need not necessarily be drawn therebetween. However, for the sake of explanatory convenience, the boundary is indicated by a two-dot chain line. Further, since the first block insulating film 45, the fourth block insulating film 48, and the tunnel insulating film 63 are also made of the same material as the third block insulating film 47, the boundaries between these films is not necessarily distinct and need not be drawn in FIG. 16. However, although the boundaries of the films need not be drawn in FIG. 16, for the sake of convenience, the boundaries thereof are drawn with a two-dot chain line for explanation.

In the structure of the sixth embodiment, similar to the semiconductor storage device 1 according to the first embodiment, the fourth block insulating films 48 and 48 are arranged in both end portions of the second block insulating film 46 in the Z direction.

The shortest distance $a_0$ between the second block insulating film 46 and the channel 61 is longer than the shortest distance b between the floating gate electrode FG and the semiconductor pillar 60. That is, there is the relationship of $a_0 > b$. Therefore, unlike the structure in which the projecting portion 460A is provided on the second block insulating film 460 illustrated in FIG. 5, the structure of the sixth embodiment can also prevent a leak current in the both end sides of the second block insulating film 46 in the Z direction.

Other operations and effects are similar to those of the semiconductor storage device 1 of the second embodiment.

Seventh Embodiment

Figure 17:
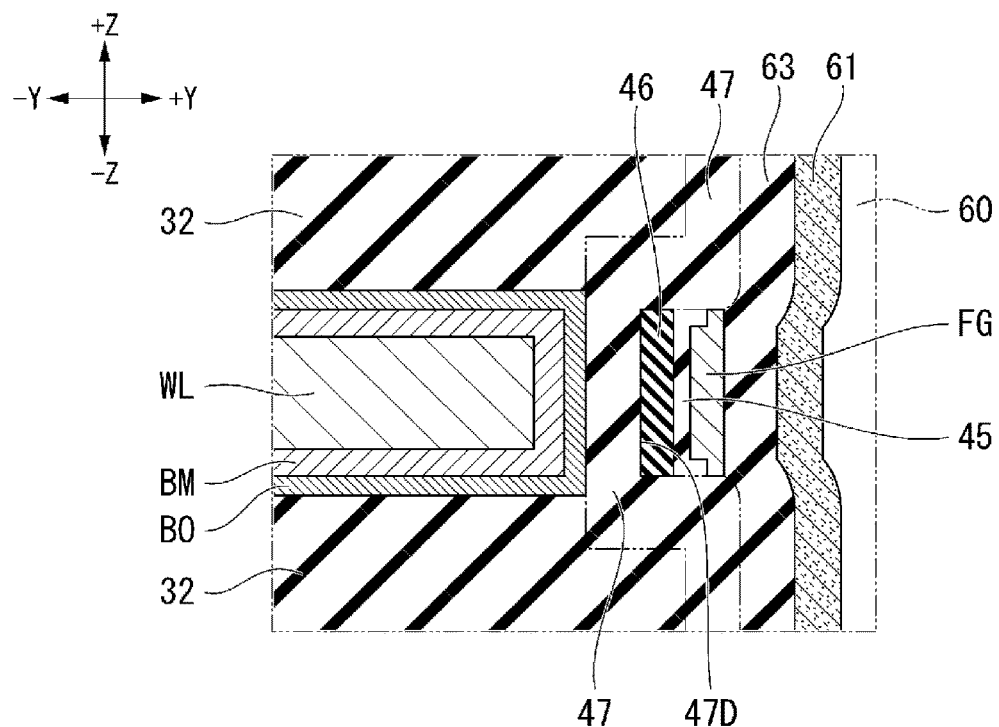
FIG. 17 is a cross-sectional view illustrating a semiconductor storage device according to a seventh embodiment.

Next, a seventh embodiment will be described with reference to FIG. 17. A semiconductor storage device according to the seventh embodiment is different from the semiconductor storage device according to the sixth embodiment in that the second block insulating film has a different length in the Z direction. The seventh embodiment has a structure similar to the structure of the semiconductor storage device according to the sixth embodiment in that the second block insulating film has a different length in the Z direction, and the floating gate electrode FG has a different length in the Z direction. The configuration of the seventh embodiment is the same as that of the sixth embodiment except for the configuration to be described below.

The length in the Z direction of the second block insulating film 46 is substantially equal to the total width in the Z direction of the word line WL and the barrier metal film BM. The length in the Z direction of the floating gate electrode FG is equal to the length in the Z direction of the second block insulating film 46. An insulating film formed between the second block insulating film 46 and the floating gate electrode FG becomes the first block insulating film. The structure in which the second block insulating film 46, the first block insulating film 45, and the floating gate electrode FG are formed in a recess portion of the third block insulating film 47 is the same as that of the sixth embodiment. However, if the boundary of each film is not drawn in FIG. 17, it is difficult to explain the shape of each film. Therefore, for the sake of convenience, a two-dot chain line is drawn along the boundary portion of each film.

The structure of the seventh embodiment is equivalent to the structure in which the fourth block insulating films 48 are arranged in the both end portions of the second block insulating film 46 in the Z direction, as in the semiconductor storage device 1 according to the first embodiment.

The shortest distance $a_0$ between the second block insulating film 46 and the channel 61 is longer than the shortest distance b between the floating gate electrode FG and the semiconductor pillar 60. That is, there is the relationship of $a_0 > b$. Therefore, unlike the structure in which the projecting portion 460A is provided on the second block insulating film 460 illustrated in FIG. 5, the structure of the sixth embodiment can also prevent a leak current in the both end sides of the second block insulating film 46 in the Z direction.

Other operations and effects are similar to those of the semiconductor storage device 1 of the sixth embodiment.

Eighth Embodiment

FIGS. 18 to 23 are cross-sectional views illustrating a portion of the process of manufacturing a semiconductor storage device according to an eighth embodiment.

The first half steps of a method of manufacturing the semiconductor storage device according to the eighth embodiment are the same as the steps of manufacturing the semiconductor storage device according to the fourth embodiment described above with reference to FIGS. 8 to 15.

Figure 18:
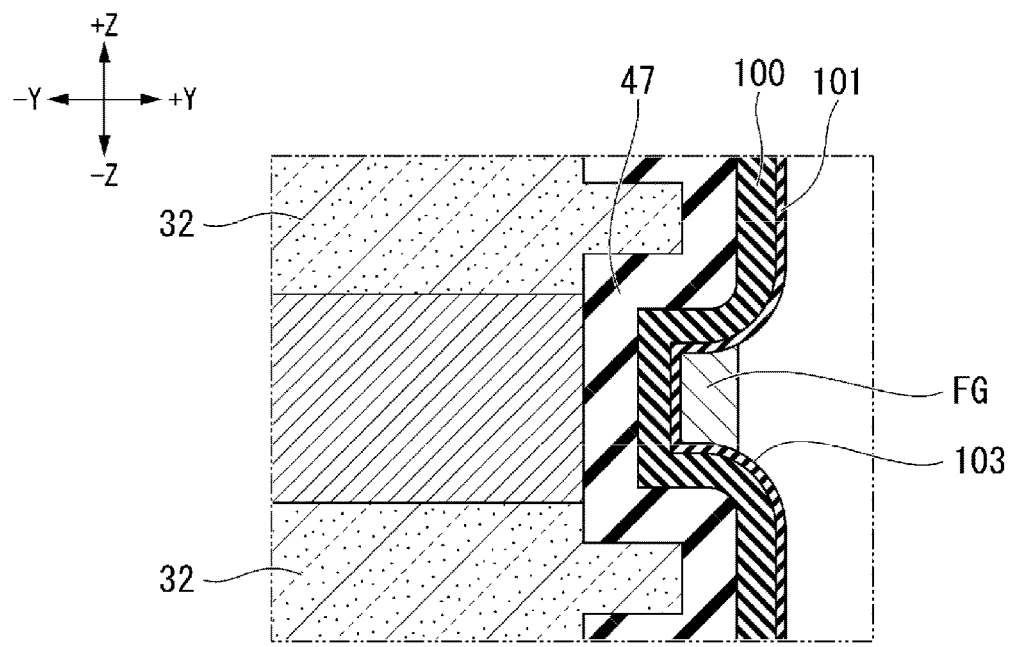
FIG. 18-22 are cross-sectional views illustrating aspects of a method of manufacturing a semiconductor storage device according to an eighth embodiment.
Figure 19:
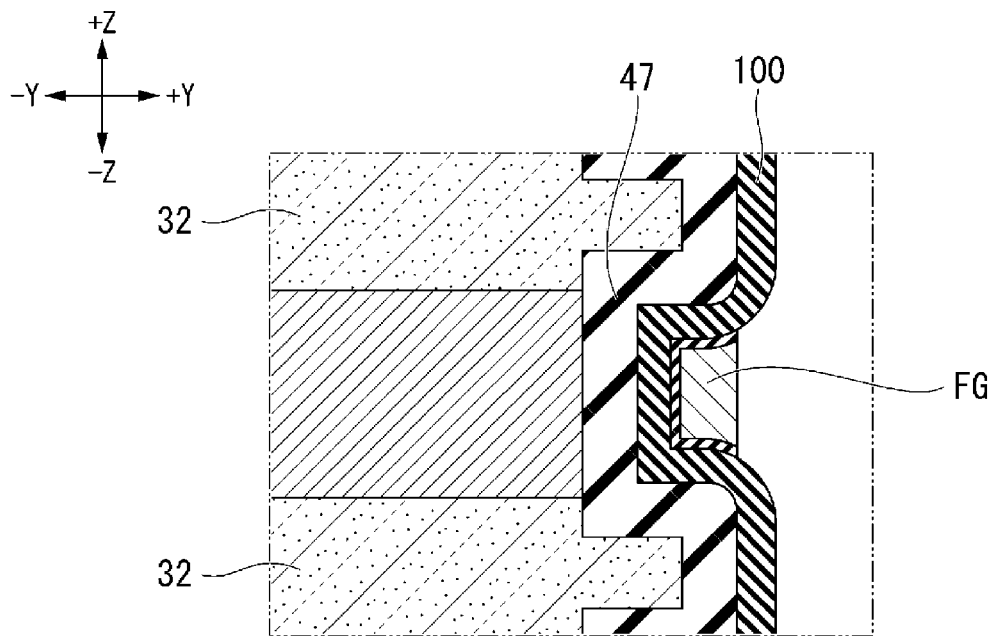
Figure 20:
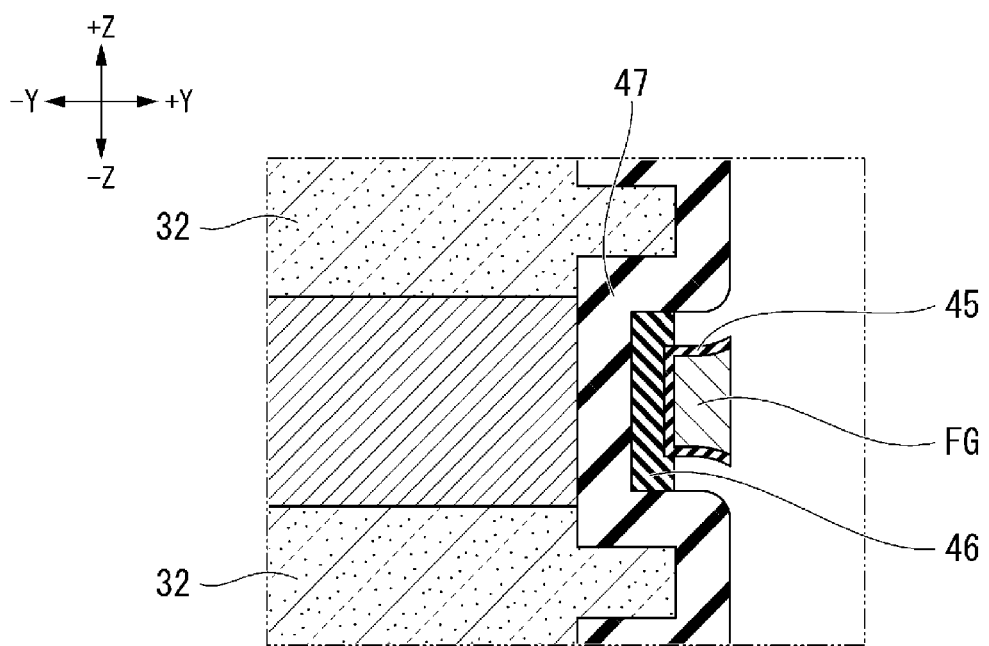
Figure 21:
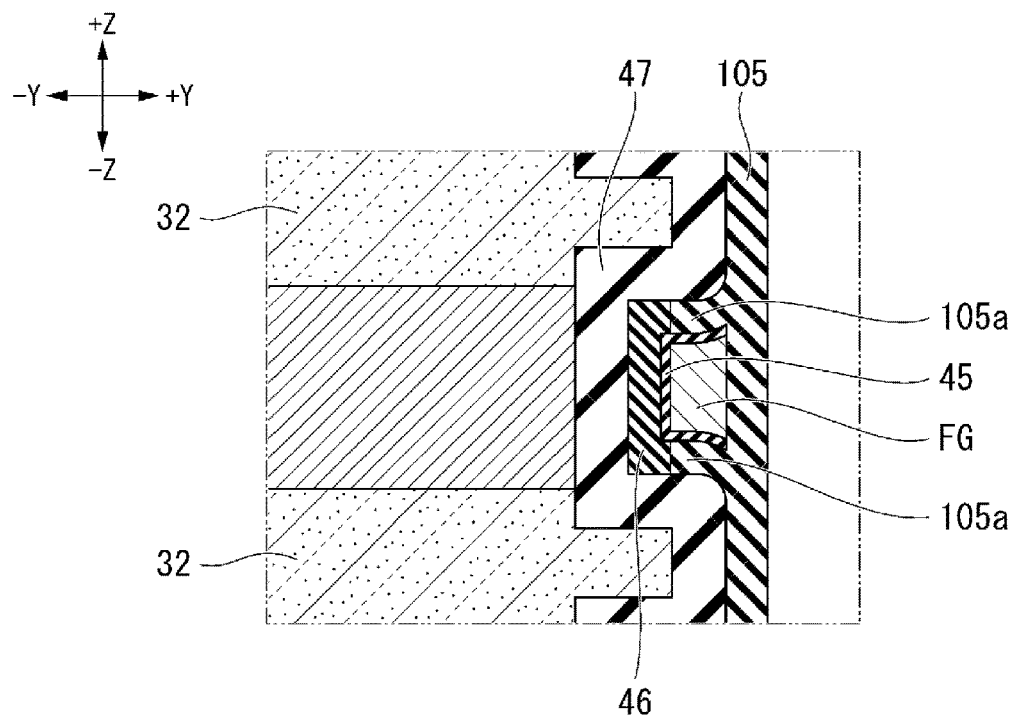

The structure illustrated in FIG. 18 is equivalent to the structure illustrated in FIG. 11, the structure illustrated in FIG. 19 is equivalent to the structure illustrated in FIG. 12, the structure illustrated in FIG. 20 is equivalent to the structure illustrated in FIG. 13, and the structure illustrated in FIG. 21 is equivalent to the structure illustrated in FIG. 14.

As illustrated in these figures, the floating gate electrode FG is formed, the recess groove 103 is formed, and etching is performed to remove the insulating film 100 using the floating gate electrode FG as a hard mask as illustrated in FIGS. 19 and 20 to form the second block insulating film 46. Next, as illustrated in FIG. 21, the insulating film 105 having a low dielectric constant is formed. The low dielectric constant insulating film 105 may become the tunnel insulating film 63.

Figure 22:
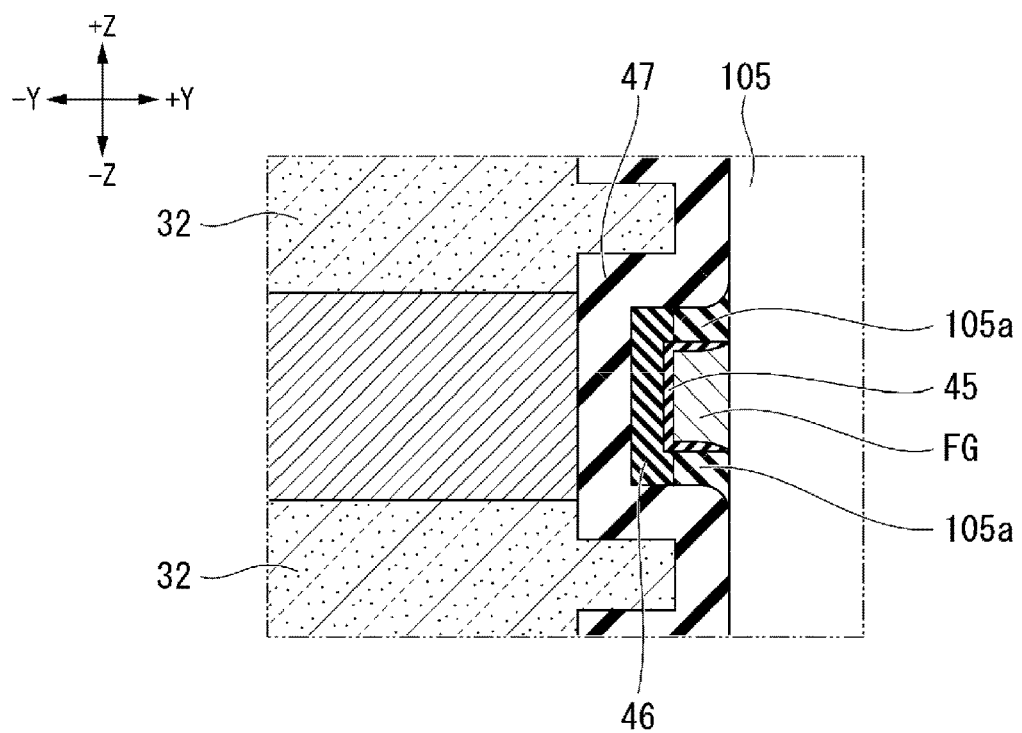
Figure 23:
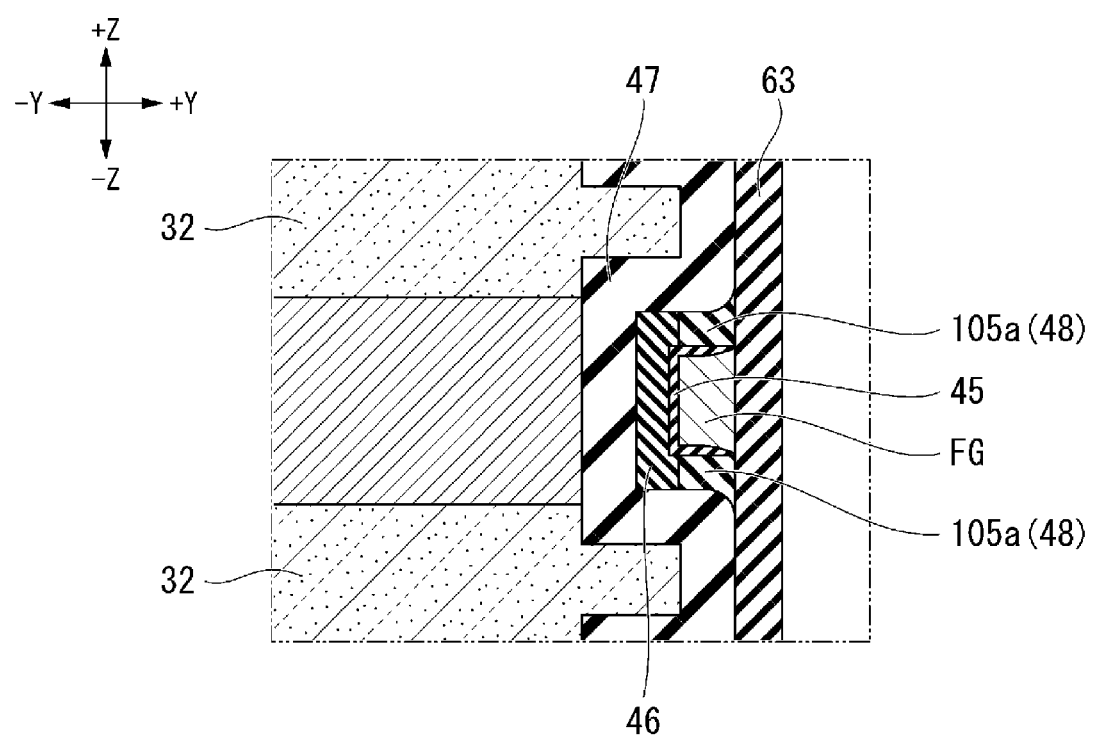
FIG. 23 is a cross-sectional view illustrating a semiconductor storage device according to an eighth embodiment.

In the fourth embodiment described above, the block insulating film and the tunnel insulating film of the semiconductor storage device are completed in the state illustrated in FIG. 21 (equivalent to FIG. 14), but in the eighth embodiment, as illustrated in FIG. 22, etching is performed so as to leave the projecting portion 105a made of a low dielectric constant material. By this etching, the +Y side end face of the floating gate electrode FG, the +Y side end face of the projecting portion 105a, and the +Y side end face of the third block insulating film 47 are processed to be flush with each other. Next, the tunnel insulating film 63 is formed as illustrated in FIG. 23. After forming the tunnel insulating film 63, the semiconductor pillar 60 is formed to complete the semiconductor storage device. Here, the tunnel insulating film 63 may be formed using a material very suitable for the tunnel insulating film.

Even in the structure illustrated in FIG. 23, the shortest distance $a_0$ between the second block insulating film 46 and the channel 61 is longer than the shortest distance b between the floating gate electrode FG and the semiconductor pillar 60. That is, there is the relationship of $a_0 > b$. Therefore, unlike the structure in which the projecting portion 460A is provided on the second block insulating film 460 illustrated in FIG. 5, the structure of the eighth embodiment can also prevent a leak current on the both end sides of the second block insulating film 46 in the Z direction. Other operations and effects are similar to those of the semiconductor storage device 1 of the fourth embodiment.

Ninth Embodiment

Next, a ninth embodiment will be described. A semiconductor storage device according to the ninth embodiment is different from the semiconductor storage device of the first embodiment in the shape of the floating gate electrode, the shape of the first block insulating film, the shape of the second block insulating film, the shape of the third block insulating film, and the shape of the fourth block insulating film. The configuration of the ninth embodiment is the same as that of the first embodiment except for the configuration to be described below.

Figure 24:
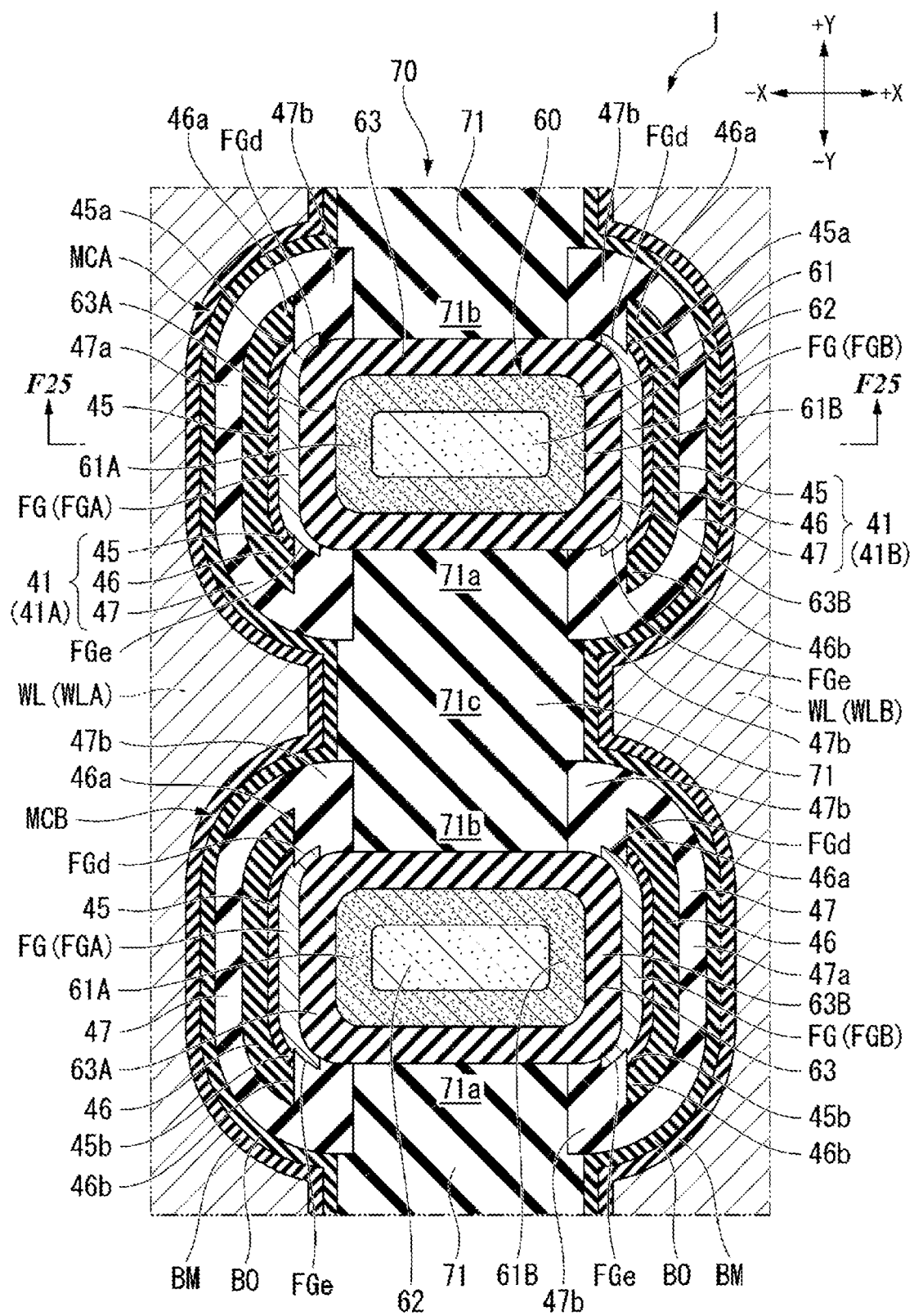
FIG. 24 is a cross-sectional view illustrating aspects of a semiconductor storage device according to a ninth embodiment.
Figure 25:
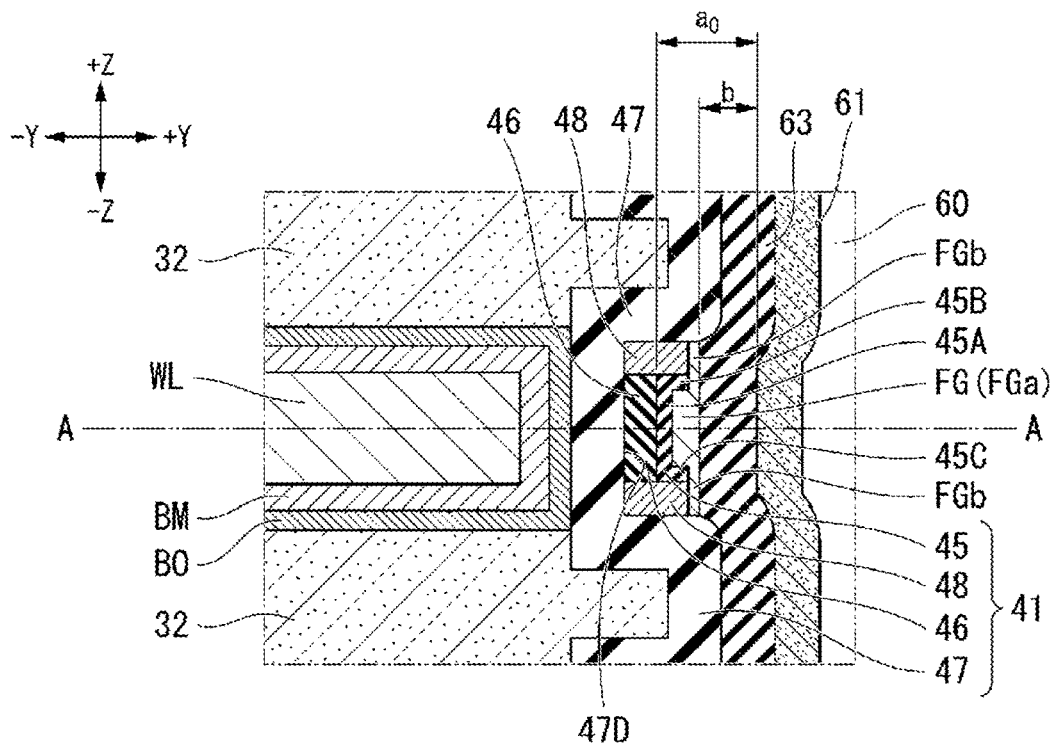
FIG. 25 is a cross-sectional view illustrating other aspects of a semiconductor storage device according to a ninth embodiment.

FIG. 24 is a cross-sectional view orthogonal to the length direction of the semiconductor pillar 60 in the semiconductor storage device 1 according to the ninth embodiment. FIG. 25 is a cross-sectional view illustrating the structure around the floating gate electrode.

In the ninth embodiment, the recess portion 47D by the third block insulating film 47 is formed between the word line WL and the floating gate electrode FG, as in the first embodiment. In the ninth embodiment, the fourth block insulating films 48 are formed on the upper and lower portions of the recess portion 47D in the Z direction so as to be spaced apart from each other. Then, the second block insulating film 46 is arranged on the word line WL side so as to be sandwiched between the upper and lower fourth block insulating films 48 in the recess portion 47D, and the first block insulating film 45 is formed on the gate electrode FG side. The gate electrode FG is formed in a dish shape so as to be located on the opening side of the recess portion 47D. The second block insulating film 46 has a uniform Y direction thickness between the upper and lower fourth block insulating films 48. In the first block insulating film 45, the central portion 45A in the Z direction has a uniform Y direction thickness, but projecting portions are formed on the both end sides of the central portion 45A in the Z direction, and a portion where the projecting portions are formed is different from the central portion 45A in the Y direction thickness.

In the first block insulating film 45, the projecting portion 45B projecting to the floating gate electrode FG side is formed at the +Z side end portion, and the projecting portion 45C projecting to the floating gate electrode FG side is formed at the −Z side end portion. In the cross section illustrated in FIG. 25, the tips of the projecting portions 45B and 45C are flush with the +Y side end surface of the fourth block insulating film 48. The gate electrode FG has a thick portion FGa formed in the central portion in the Z direction, and a thin portion FGb is formed on the +Z side and the −Z side of the thick portion FGa. The gate electrode FG is in contact with the central portion 45A and the projecting portions 45B and 45C of the second block insulating film 46 by the thick portion FGa. The gate electrode FG is in contact with the tips of the projecting portions 45B and 45C of the second block insulating film 46 and the +Y side end surface of the fourth block insulating film 48 by the thin portion FGb.

In the cross section illustrated in FIG. 25, the floating gate electrode FG has a thin portion FGa and a thick portion FGb. In the cross section illustrated in FIG. 24, the floating gate electrode FG has a projecting portion FGd at the end portion in the +Y direction and a projecting portion FGe at the end portion in the −Y direction. The projecting portion FGd extends along the tunnel insulating film 63 so as to project ahead of the first curved portion 45a of the first block insulating film 45 and the first curved portion 46a of the second block insulating film 46. The projecting portion FGe extends along the tunnel insulating film 63 so as to project ahead of the second curved portion 45b of the first block insulating film 45 and the second curved portion 46b of the second block insulating film 46. The second covering portion 47b of the third block insulating film 47 is provided on a portion of the projecting portion FGd projecting from the first curved portion 45a and the first curved portion 46a. The second covering portion 47b of the third block insulating film 47 is provided on a portion of the projecting portion FGe projecting from the second curved portion 45b and the second curved portion 46b.

In the structure according to the ninth embodiment, similarly to the semiconductor storage device 1 according to the first embodiment, the fourth block insulating films 48 are arranged in both end portions of the second block insulating film 46 in the Z direction.

The shortest distance $a_0$ between the second block insulating film 46 and the channel 61 is longer than the shortest distance b between the floating gate electrode FG and the semiconductor pillar 60. That is, there is the relationship of $a_0 > b$. Therefore, unlike the structure illustrated in FIG. 5 in which the projecting portion 460A is provided on the second block insulating film 460, the structure of the ninth embodiment can prevent a leak current in the both sides of the second block insulating film 46 in the Z direction.

Further, in the ninth embodiment, the projecting portions FGd and FGe of the floating gate electrode FG are projected, but these are prevented from contacting the second block insulating film 46 due to the presence of the second covering portion 47b of the third block insulating film 47. Therefore, in the structure according to the ninth embodiment, it is possible to prevent charge transfer from the floating gate electrode FG to the second block insulating film 46 side, thereby providing a structure having good writing characteristics.

Other operations and effects are similar to those of the semiconductor storage device 1 of the first embodiment.

Tenth Embodiment

Next, a tenth embodiment will be described. A semiconductor storage device 1 according to the tenth embodiment is different from the semiconductor storage device 1 according to the ninth embodiment in the shape of the fourth block insulating film. The configuration of the tenth embodiment is the same as that of the ninth embodiment except for the configuration to be described below.

Figure 26:
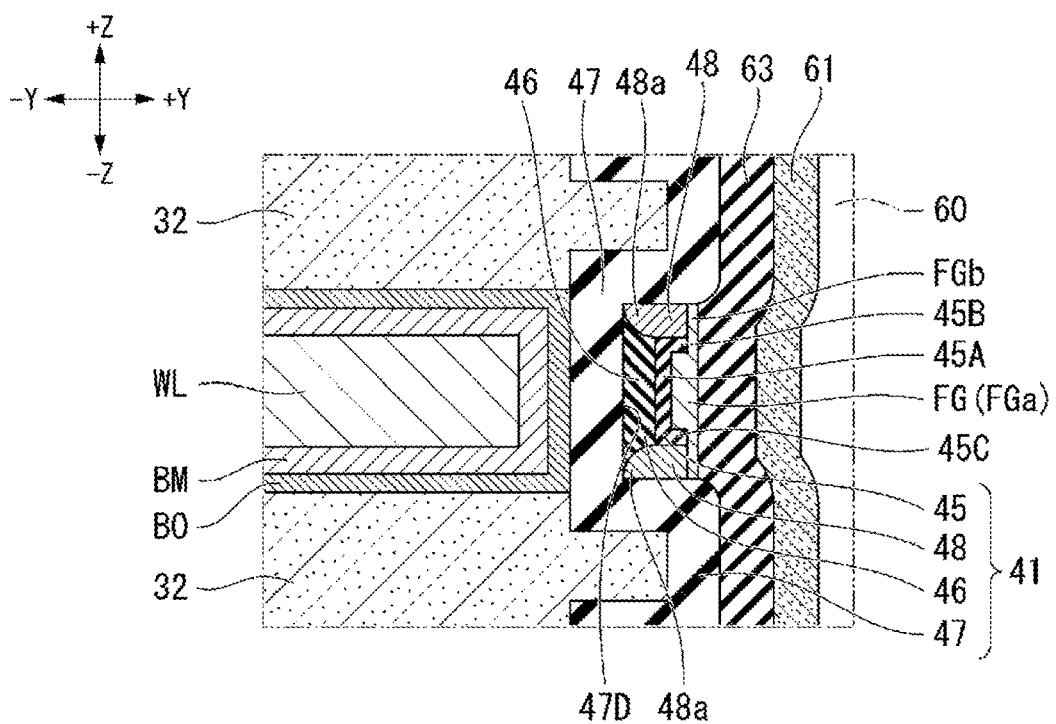
FIG. 26 is a cross-sectional view illustrating a semiconductor storage device according to a tenth embodiment.

FIG. 26 is a cross-sectional view illustrating the structure around the floating gate electrode in the semiconductor storage device 1 according to the tenth embodiment.

In the tenth embodiment, the recess portion 47D by the third block insulating film 47 is formed between the word line WL and the floating gate electrode FG. In the tenth embodiment, the fourth block insulating films 48 are formed on the upper and lower portions of the recess portion 47D in the Z direction so as to be separated from each other. In the present embodiment, the thickness in the Z direction of the end portion 48a of the fourth block insulating film 48 in the −Y direction is gradually thinner toward the −Y direction. Further, the Y direction thickness of the second block insulating film 46 is not uniform in the upper and lower portions in the Z direction, but becomes thinner in the upper portion of the second block insulating film 46 in the +Z direction toward the +Z direction. The Y direction thickness of the second block insulating film 46 becomes thinner in the lower portion of the second block insulating film 46 in the −Z direction toward the −Z direction.

The structure illustrated in FIG. 26 may be manufactured by adopting the manufacturing process illustrated in FIGS. 18 to 20 and adjusting the etching conditions. As illustrated in FIG. 20, it may be obtained by adjusting a recess amount by etching in the step of performing etching to remove the insulating film 100 using the floating gate electrode FG as a hard mask and form the second block insulating film 46.

In the structure according to the tenth embodiment, similar to the semiconductor storage device 1 according to the first embodiment, the fourth block insulating films 48 are arranged in both end portions of the second block insulating film 46 in the Z direction.

The shortest distance $a_0$ between the second block insulating film 46 and the channel 61 is longer than the shortest distance b between the floating gate electrode FG and the semiconductor pillar 60. That is, there is the relationship of $a_0 > b$. Therefore, unlike the structure illustrated in FIG. 5 in which the projecting portion 460A is provided on the second block insulating film 460, in the structure of the tenth embodiment, it is possible to prevent a leak current in the both end sides of the second block insulating film 46 in the Z direction.

Further, in the tenth embodiment, as in the ninth embodiment, the projecting portions FGd and FGe of the floating gate electrode FG are projected, but these are prevented from contacting the second block insulating film 46 due to the presence of the second covering portion 47b of the third block insulating film 47. Therefore, in the structure according to the tenth embodiment, it is possible to prevent charge transfer from the floating gate electrode FG to the second block insulating film 46 side, thereby providing a structure having good writing characteristics.

Other operations and effects are the same as those of the semiconductor storage device 1 of the first embodiment.

Various embodiments and modifications have been described above, but the present disclosure is not limited to the above-described embodiments and modifications. For example, two or more of the described embodiments and modifications may be implemented in combination with each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
    a semiconductor pillar including a semiconductor layer and extending along a first direction;
    a first wiring extending along a second direction crossing the first direction;
    a first electrode between the semiconductor pillar and the first wiring;
    a first insulating layer between the first electrode and the first wiring and adjacent to the first electrode;
    a second insulating layer between the first insulating layer and the first wiring and adjacent to the first insulating layer, the second insulating layer having a higher dielectric constant than the first insulating layer; and
    a third insulating layer between the second insulating layer and the first wiring, the third insulating layer having a length longer than the second insulating layer in the first direction, wherein
    a shortest distance between the second insulating layer and the semiconductor layer in the second direction is greater than a shortest distance between the first electrode and the semiconductor layer in the second direction.

2. The semiconductor memory device according to claim 1, further comprising:
    a fourth insulating layer between the semiconductor layer and the first electrode.

3. The semiconductor memory device according to claim 1, wherein a maximum thickness of the second insulating layer in the second direction is less than $A+D+(½)F$, where A is a thickness of the second insulating layer along a line that extends along the second direction and passes through a center of the first wiring in the first direction, D is a thickness of the first insulating layer along the line, and F is a thickness of the first electrode along the line.

4. The semiconductor memory device according to claim 1, wherein the third insulating layer has a lower dielectric constant than the second insulating layer.

5. The semiconductor memory device according to claim 1, wherein the first insulating layer includes a same material as the third insulating layer.

6. The semiconductor memory device according to claim 5, further comprising:
    a fourth insulating layer arranged between the first electrode and the semiconductor layer and including the same material as the first and third insulating layers.

7. The semiconductor memory device according to claim 1, further comprising:
    a fifth insulating layer between the semiconductor layer and each end portion of the second insulating layer in the first direction, the fifth insulating layer having a lower dielectric constant than the second insulating layer.

8. The semiconductor memory device according to claim 7, wherein the first insulating layer includes end portions in the first direction, each of the end portions protruding towards the semiconductor layer and adjacent to the fifth insulating layer.

9. The semiconductor memory device according to claim 7, wherein said each end portion of the second insulating layer is adjacent to the third insulating layer in the first direction.

10. The semiconductor memory device according to claim 1, further comprising:
   one or more films that cover the first wiring, wherein the length of the second insulating layer in the first direction is greater than a total thickness of the one or more films and the first wiring in the first direction.

11. The semiconductor memory device according to claim 1, wherein the second insulating layer includes projecting portions at both ends thereof in the first direction, the projecting portions projecting toward the semiconductor pillar.

12. The semiconductor memory device according to claim 11, further comprising:
   a fifth insulating layer arranged between the semiconductor layer and each of the projecting portions and having a lower dielectric constant than the second insulating layer.

13. The semiconductor memory device according to claim 1, wherein the length of the second insulating layer in the first direction is greater than a length of the first electrode in the first direction.

* * * * *